(12) United States Patent
Ishihara et al.

(10) Patent No.: US 8,455,941 B2
(45) Date of Patent: Jun. 4, 2013

(54) NONVOLATILE SEMICONDUCTOR MEMORY DEVICE AND METHOD FOR MANUFACTURING THE SAME

(75) Inventors: Takamitsu Ishihara, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 12/980,856

(22) Filed: Dec. 29, 2010

(65) Prior Publication Data

US 2011/0309432 A1    Dec. 22, 2011

(30) Foreign Application Priority Data

Jun. 22, 2010    (JP) .................................. 2010-141924

(51) Int. Cl.
*H01L 29/792* (2006.01)
(52) U.S. Cl.
USPC ..... 257/326; 257/314; 257/324; 257/E29.309
(58) Field of Classification Search
USPC .................. 257/324, 314–316, 326, E29.309
See application file for complete search history.

(56) References Cited

U.S. PATENT DOCUMENTS

| 7,847,342 | B2 | 12/2010 | Fukuzumi et al. |
| 7,933,151 | B2 | 4/2011 | Maeda et al. |
| 2010/0038703 | A1 | 2/2010 | Fukuzumi et al. |
| 2010/0207195 | A1 | 8/2010 | Fukuzumi et al. |
| 2010/0244119 | A1 * | 9/2010 | Fukuzumi et al. ............ 257/324 |

FOREIGN PATENT DOCUMENTS

| JP | 2009-146954 | 7/2009 |
| JP | 2010-45149 | 2/2010 |
| JP | 4468433 | 3/2010 |
| KR | 10-2009-0125893 | 12/2009 |
| KR | 10-2010-0054742 | 5/2010 |

OTHER PUBLICATIONS

Korean Office Action issued Dec. 28, 2012 in Korean patent application No. 10-2011-0060257 (with English translation).

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

A nonvolatile semiconductor memory device includes a stacked body including electrode films stacked in a first direction; a conductive pillar piercing the stacked body in the first direction; an inner insulating film, a semiconductor pillar, an intermediate insulating film, a memory layer, and an outer insulating film provided between the conductive pillar and the electrode films. The inner insulating film is provided around a side face of the conductive pillar. The semiconductor pillar is provided around a side face of the inner insulating film. The intermediate insulating film is provided around a side face of the semiconductor pillar. The memory layer is provided around a side face of the intermediate insulating film. The outer insulating film is provided around a side face of the memory layer.

17 Claims, 19 Drawing Sheets

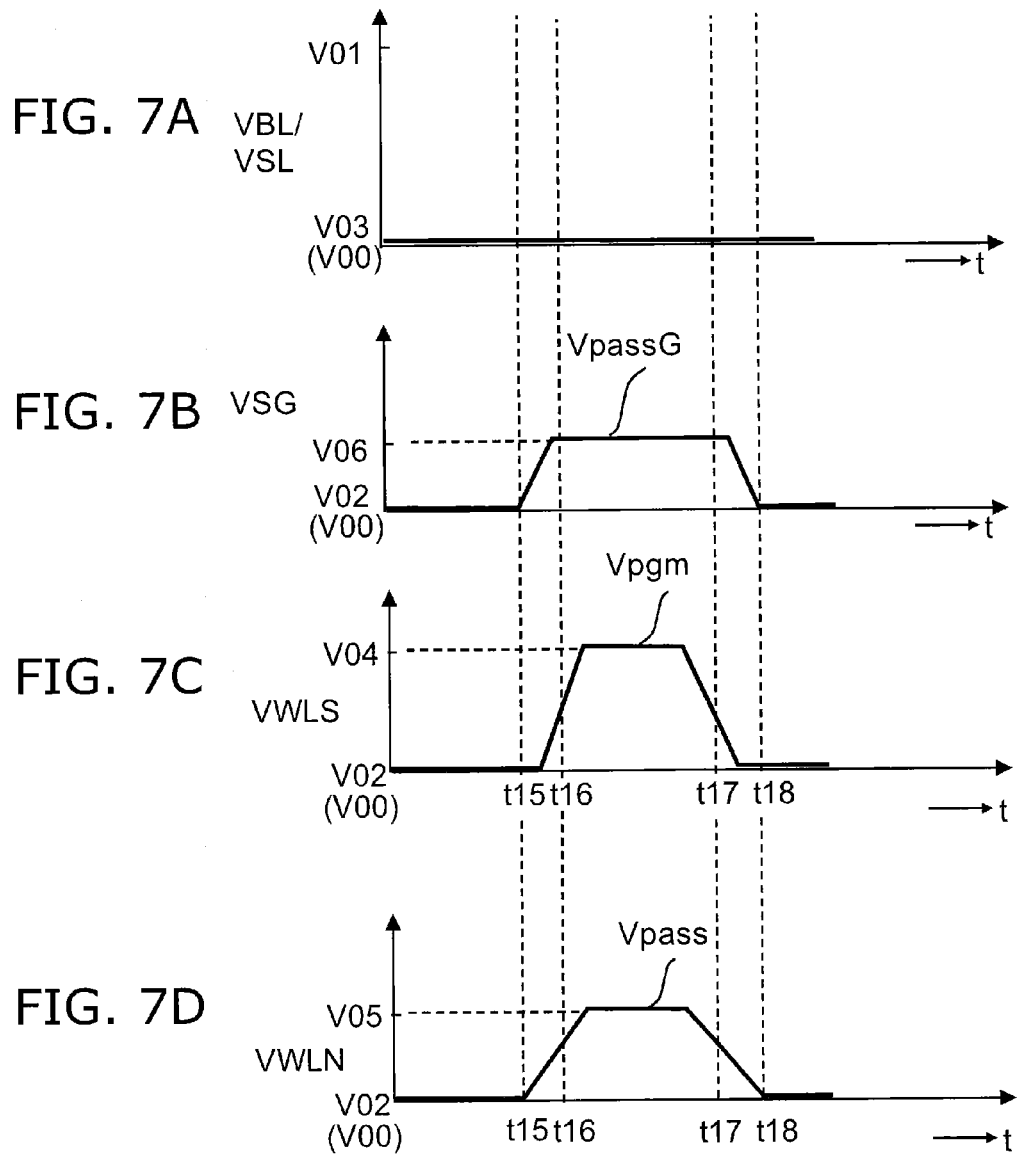

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-141924, filed on Jun. 22, 2010; the entire contents of which are incorporated herein by reference.

FIELD

Embodiments described herein relate generally to a nonvolatile semiconductor memory device and a method for manufacturing the same.

BACKGROUND

Conventional nonvolatile semiconductor memory devices have elements integrated in a two-dimensional plane on a silicon substrate. Although the dimensions of one element are downscaled to increase the storage capacity of the memory, such downscaling in recent years has become difficult in regard to both cost and technology.

Conversely, collectively patterned three-dimensionally stacked memories have been proposed. In such a collectively patterned three-dimensionally stacked memory, a stacked body including alternately stacked insulating films and electrode films is provided; a silicon pillar is provided to pierce the stacked body in the stacking direction; and a charge storage layer (a memory layer) is provided between the silicon pillar and the electrode films. Thereby, memory cells are provided at the intersections between the silicon pillar and the electrode films. Further, configurations also have been proposed in which two of the silicon pillars are connected on the substrate side to form a memory string having a U-shaped configuration.

In such a collectively patterned three-dimensionally stacked memory, there is room to further improve the operational performance.

BRIEF DESCRIPTION OF THE DRAWINGS

FIG. 7A, FIG. 7B, FIG. 7C, and FIG. 7D are schematic views illustrating the operations of the nonvolatile semiconductor memory device according to the first embodiment;

DETAILED DESCRIPTION

Figure 1:
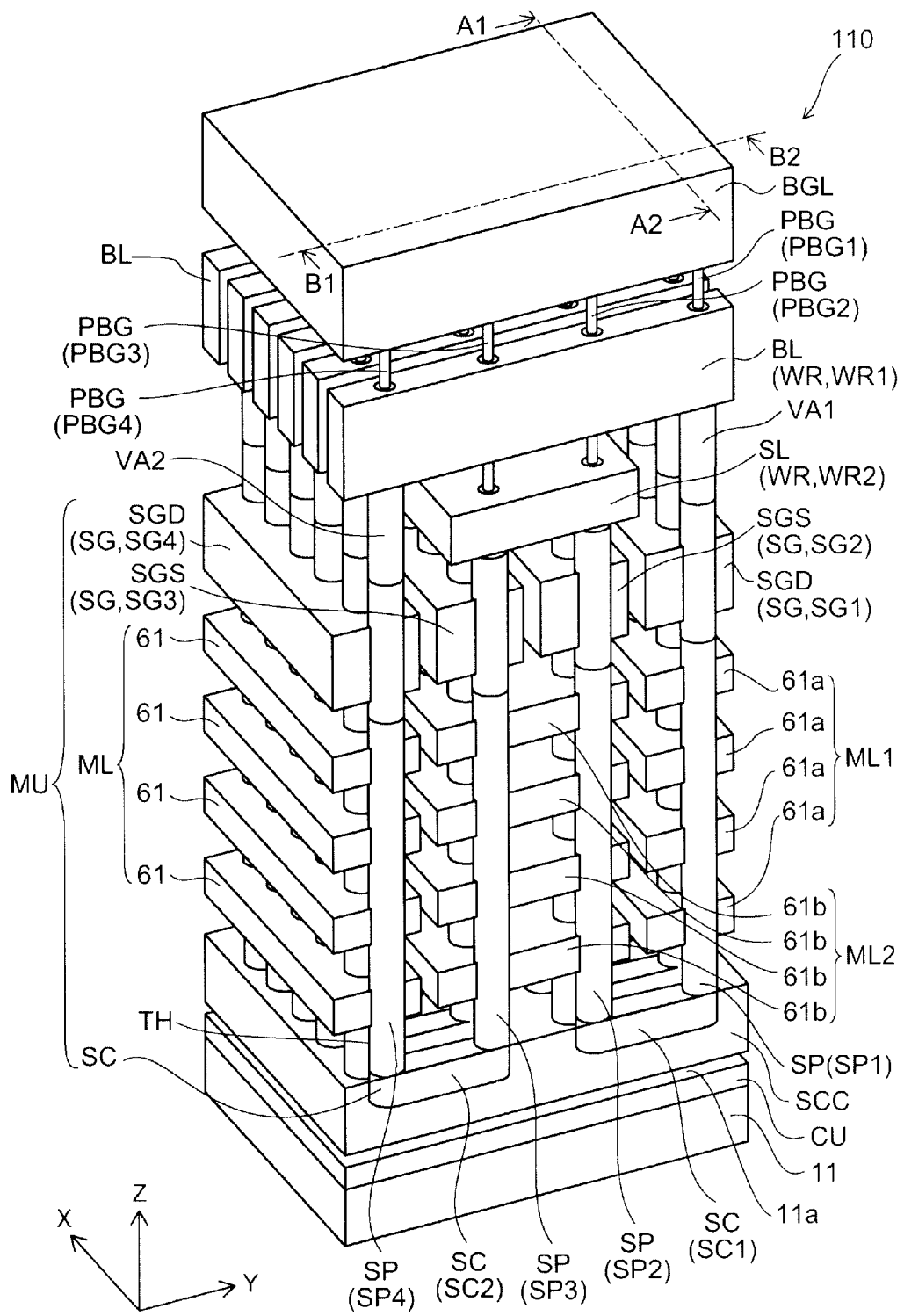
FIG. 1 is a schematic perspective view illustrating a nonvolatile semiconductor memory device according to a first embodiment.

In general, according to one embodiment, a nonvolatile semiconductor memory device includes a first stacked body, a first conductive pillar, a first pillar inner insulating film, a first semiconductor pillar, a first pillar intermediate insulating film, a first pillar memory layer and a first pillar outer insulating film. The first stacked body includes a plurality of first electrode films stacked in a first direction and a first inter-electrode insulating film provided between the plurality of first electrode films. The first conductive pillar pierces the first stacked body in the first direction. The first pillar inner insulating film is provided between the first conductive pillar and the first electrode films. The first pillar inner insulating film is provided around a side face of the first conductive pillar. The first semiconductor pillar is provided between the first pillar inner insulating film and the first electrode films to pierce the first stacked body along the first direction. The first semiconductor pillar is provided around a side face of the first pillar inner insulating film. The first pillar intermediate insulating film is provided between the first semiconductor pillar and the first electrode films. The first pillar intermediate insulating film is provided around a side face of the first semiconductor pillar. The first pillar memory layer is provided between the first pillar intermediate insulating film and the first electrode films. The first pillar memory layer is provided around a side face of the first pillar intermediate insulating film. The first pillar outer insulating film is provided between the first pillar memory layer and the first electrode films. The first pillar outer insulating film is provided around a side face of the first pillar memory layer.

In general, according to one embodiment, a method for manufacturing a nonvolatile semiconductor memory device is disclosed. The method can include making a through-hole piercing a stacked body and an inter-layer insulating film along a first direction. The inter-layer insulating film is stacked with the stacked body. The stacked body includes a plurality of electrode films stacked in the first direction and an inter-electrode insulating film provided between the plurality of electrode films. The method can include depositing a stacked film of a film used to form a pillar outer insulating film, a film used to form a pillar memory layer, a film used to form a pillar intermediate insulating film, a film used to form a semiconductor pillar, a film used to form a pillar inner insulating film, and a film used to form a conductive pillar sequentially on an inner wall of the through-hole. The method can include exposing the film used to form the pillar outer insulating film by performing etch-back of at least a portion of the inter-layer insulating film. The method can include exposing a side face of the film used to form the semiconductor pillar by removing the exposed film used to form the pillar outer insulating film, the film used to form the pillar memory layer, and the film used to form the pillar intermediate insulating film. In addition, the method can include forming a film used to form an interconnect. The film used to form the interconnect is electrically connected to the exposed side face of the film used to form the semiconductor pillar.

Embodiments will now be described with reference to the drawings.

The drawings are schematic or conceptual; and the relationships between the thickness and width of portions, the proportions of sizes among portions, etc., are not necessarily the same as the actual values thereof. The dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic perspective view illustrating the configuration of a nonvolatile semiconductor memory device according to a first embodiment.

For easier viewing of the drawing in FIG. 1, only the conductive portions are illustrated, and the insulating portions are omitted.

Figure 2:
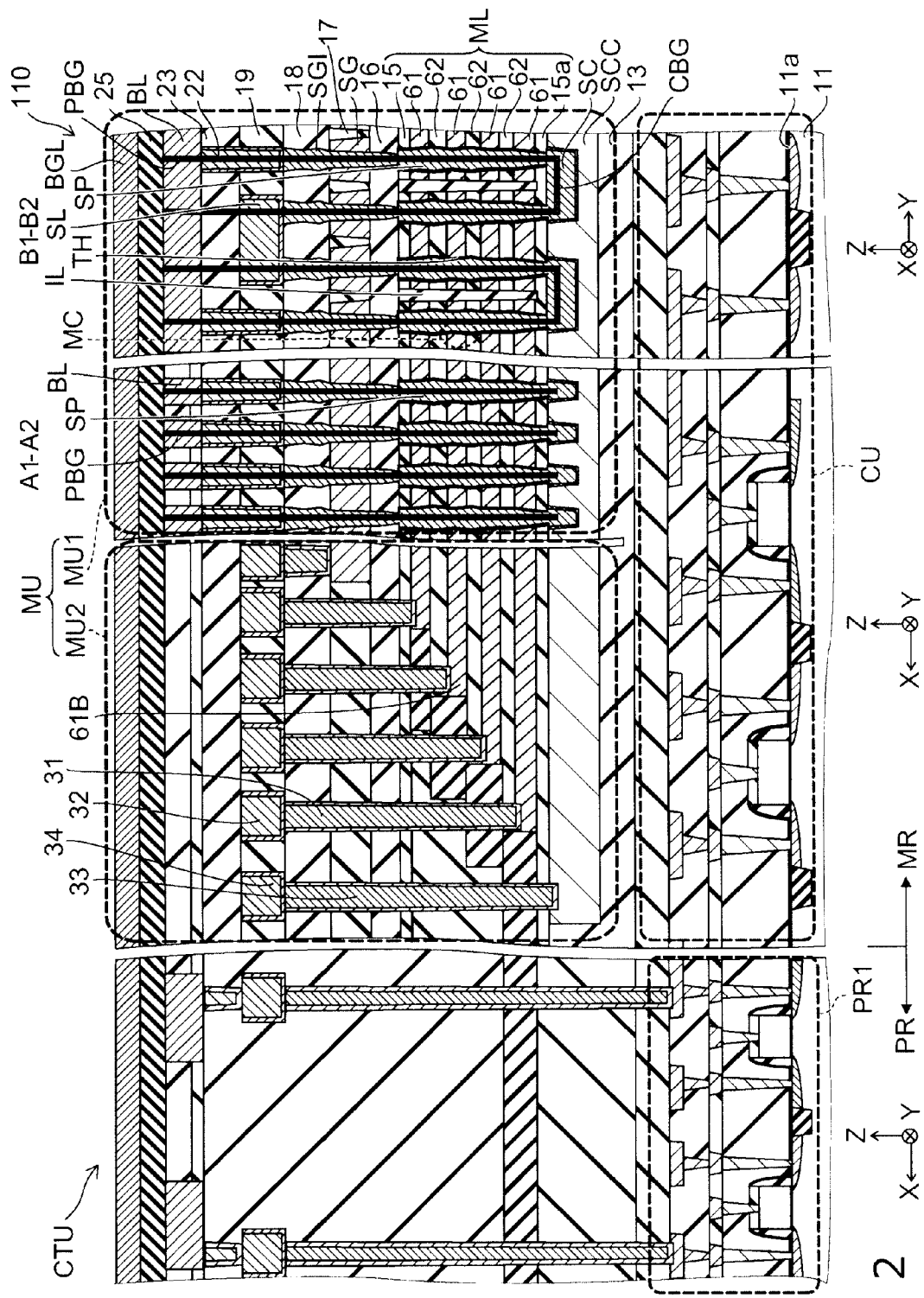
FIG. 2 is a schematic cross-sectional view illustrating the nonvolatile semiconductor memory device according to the first embodiment.

FIG. 2 is a schematic cross-sectional view illustrating the configuration of the nonvolatile semiconductor memory device according to the first embodiment.

Figure 3:
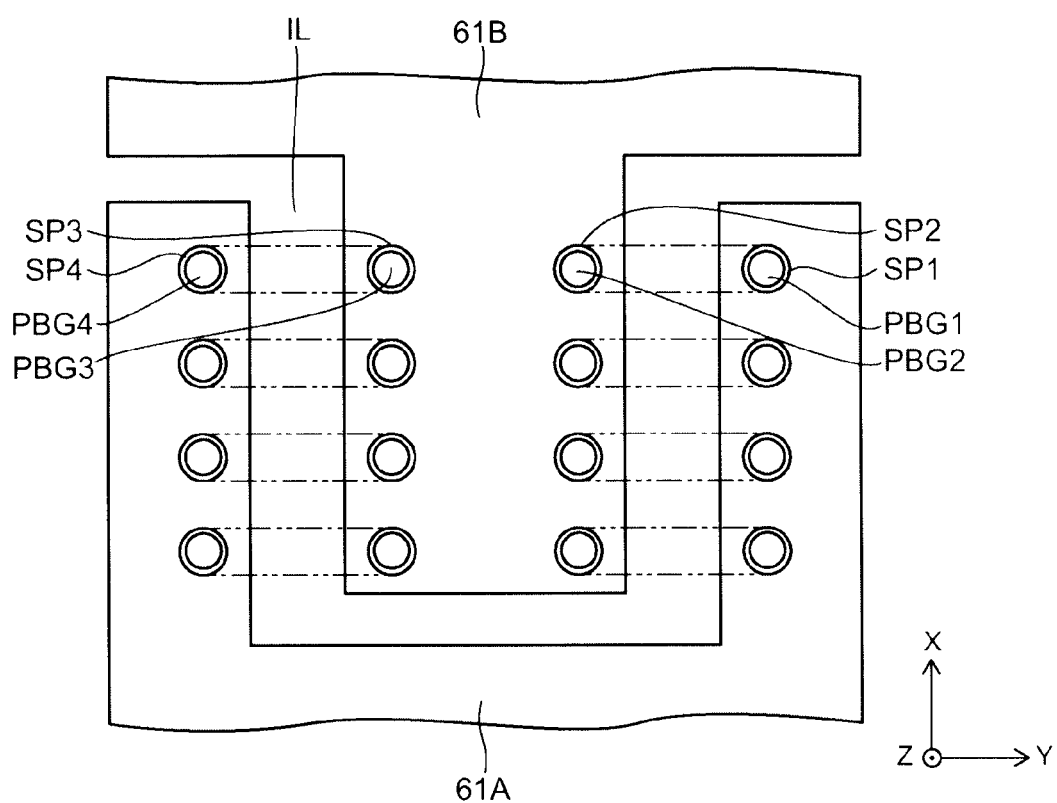
FIG. 3 is a schematic plan view illustrating the electrode film of the nonvolatile semiconductor memory device according to the first embodiment.

FIG. 3 is a schematic plan view illustrating the configuration of the electrode film of the nonvolatile semiconductor memory device according to the first embodiment.

Figure 4:
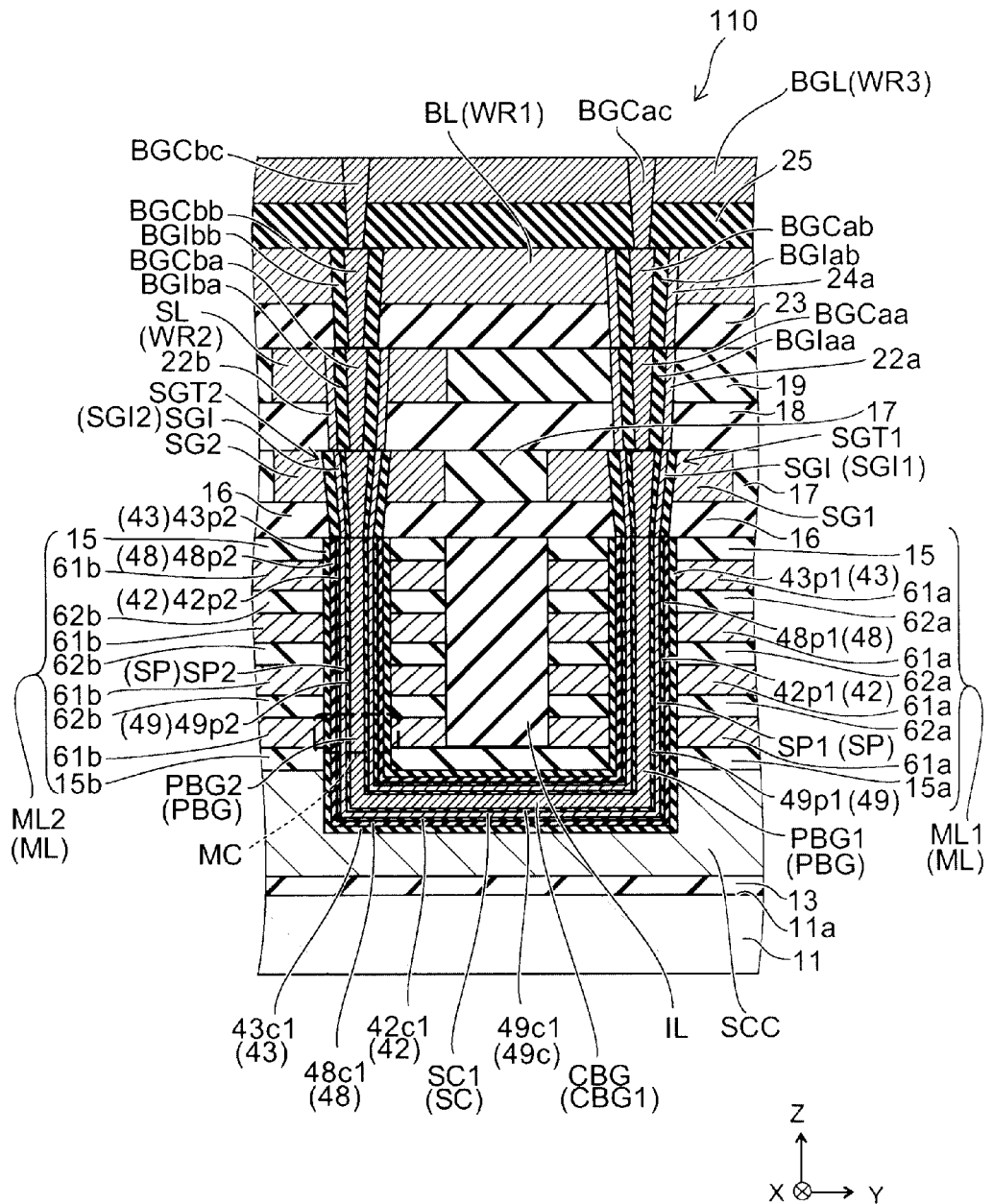
FIG. 4 is a schematic cross-sectional view illustrating a portion of the nonvolatile semiconductor memory device according to the first embodiment.

FIG. 4 is a schematic cross-sectional view illustrating the configuration of a portion of the nonvolatile semiconductor memory device according to the first embodiment.

Figure 5A:
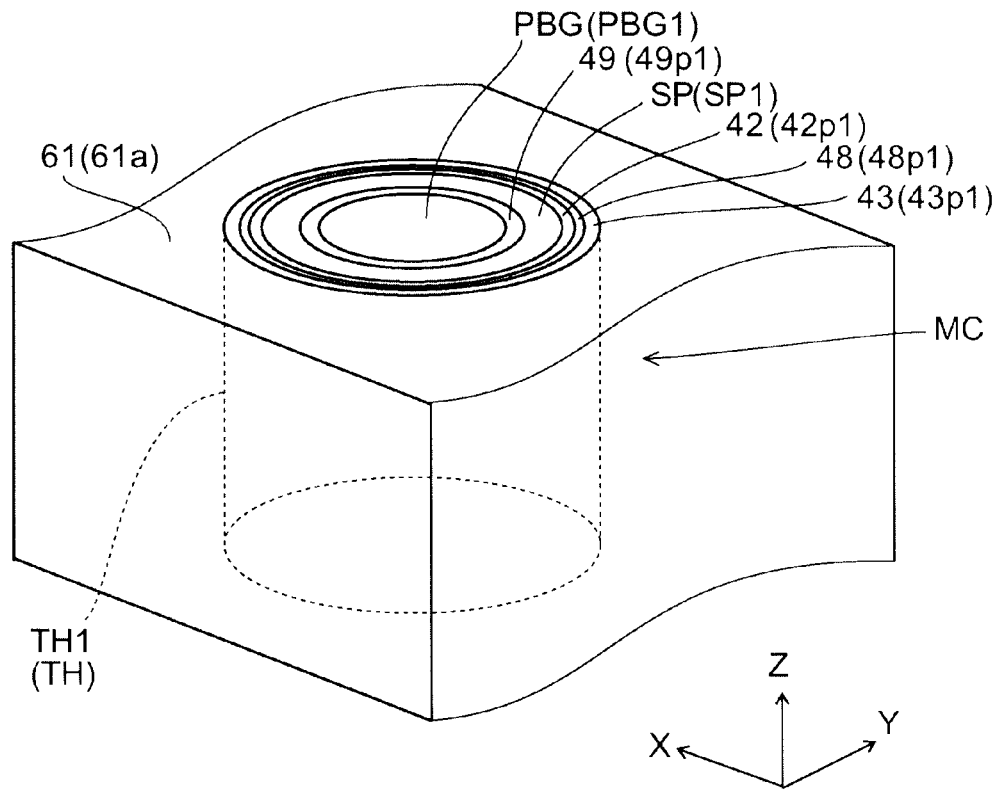
FIGS. 5A and 5B are schematic views illustrating the nonvolatile semiconductor memory device according to the first embodiment.
Figure 5B:
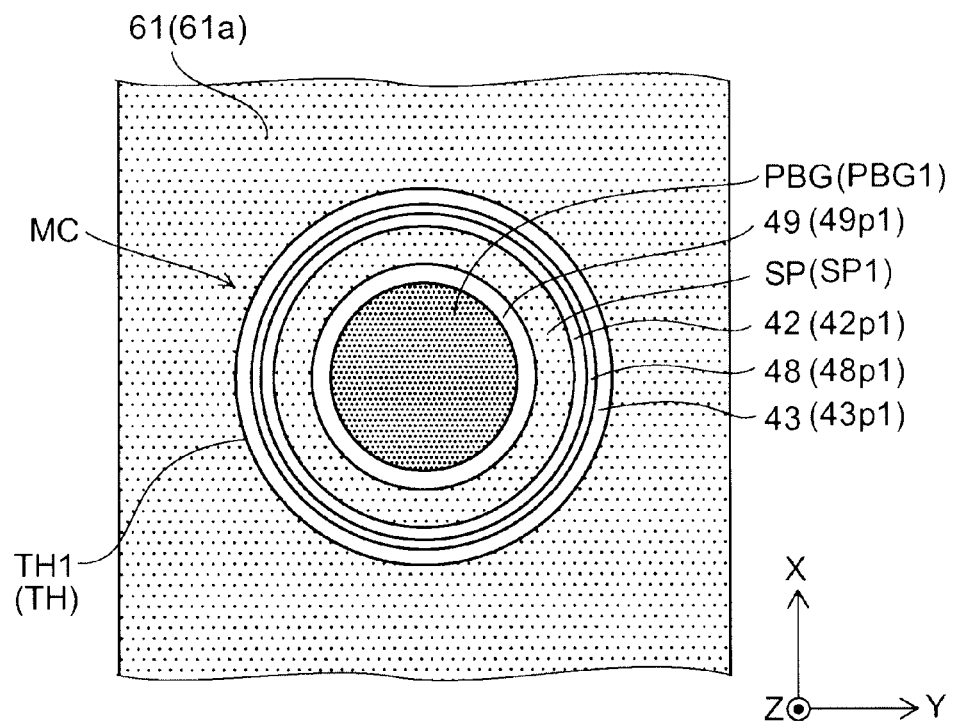

FIGS. 5A and 5B are schematic views illustrating the configuration of the nonvolatile semiconductor memory device according to the first embodiment.

The nonvolatile semiconductor memory device 110 according to this embodiment is, for example, a three-dimensionally stacked flash memory.

As illustrated in FIG. 1 and FIG. 2, a substrate 11 (a semiconductor substrate) made of, for example, monocrystalline silicon may be provided in the nonvolatile semiconductor memory device 110.

For example, a memory array region MR, in which memory cells are formed, and a peripheral region PR, which is provided together with the memory array region MR, may be set in the substrate 11 as illustrated in FIG. 2. The memory array region MR may be provided, for example, in the central side of the substrate 11; and the peripheral region PR may be provided, for example, in the substrate 11 outside the memory array region MR. Various peripheral region circuits PR1, for example, may be provided on a major surface 11a of the substrate 11 in the peripheral region PR.

For example, a circuit unit CU may be provided on the major surface 11a of the substrate 11 in the memory array region MR; and a memory unit MU may be provided on the circuit unit CU. The circuit unit CU may be provided as necessary and may be omitted. An inter-layer insulating film 13 made of, for example, silicon oxide, is provided between the circuit unit CU and the memory unit MU (referring to FIG. 2).

As illustrated in FIG. 2, the memory unit MU includes, for example, a matrix memory cell unit MU1 and an interconnect connection unit MU2. The matrix memory cell unit MU1 includes memory cell transistors arranged in a three dimensional matrix configuration. The interconnect connection unit MU2 connects interconnects of the matrix memory cell unit MU1. The multiple memory cell transistors are arranged, for example, in a three-dimensional matrix configuration along the three directions of a direction perpendicular to the major surface 11a of the substrate 11 and two mutually different directions parallel to the major surface 11a.

FIG. 1 illustrates the configuration of the matrix memory cell unit MU1.

FIG. 2 illustrates a portion of the cross section along line A1-A2 of FIG. 1 and a portion of the cross section along line B1-B2 of FIG. 1 as the matrix memory cell unit MU1.

In the matrix memory cell unit MU1 as illustrated in FIG. 1 and FIG. 2, a stacked body ML is provided on the major surface 11a of the substrate 11.

The stacked body ML includes multiple electrode films 61 and multiple inter-electrode insulating films 62 stacked alternately in a first direction. The inter-electrode insulating film 62 functions as an inter-layer insulating film that insulates the electrode films 61 from each other.

In the specification of the application, in addition to the case where multiple layers are directly overlaid, stacking also includes the case where multiple layers are overlaid with other components inserted therebetween.

The stacking direction of the electrode films 61 and the inter-electrode insulating film 62 in the stacked body ML is taken as a Z-axis direction (the first direction). The Z-axis direction is a direction perpendicular to the major surface 11a of the substrate 11. One direction perpendicular to the Z-axis direction is taken as a Y-axis direction (a second direction). A direction perpendicular to the Z-axis direction and the Y-axis direction is taken as an X-axis direction (a third direction).

The nonvolatile semiconductor memory device 110 further includes a selection gate electrode SG. The selection gate electrode SG is stacked with the stacked body ML along the Z-axis direction.

The electrode film 61 has a portion having a band configuration extending along the X-axis direction. The selection gate electrode SG also has a portion having a band configuration extending along the X-axis direction.

A semiconductor pillar SP is provided to pierce the stacked body ML and the selection gate electrode SG in the Z-axis direction. The semiconductor pillar SP is formed by, for example, filling a semiconductor into a through-hole TH piercing the stacked body ML in the Z-axis direction. The semiconductor pillar SP has a tubular configuration (e.g., a cylindrical configuration) extending in the Z-axis direction.

In the nonvolatile semiconductor memory device 110, a conductive pillar PBG is provided in the interior of each of the semiconductor pillars SP having the cylindrical configurations with an interposed insulating layer described below. The conductive pillar PBG may have a columnar configuration or a tubular configuration. In other words, the interior of the conductive pillar PBG may be hollow; and, for example, an insulating layer and the like may be provided inside the conductive pillar PBG.

In the nonvolatile semiconductor memory device 110 as described below, a memory cell transistor having a memory layer is formed at the portion where the electrode films 61 and the semiconductor pillar SP intersect. The memory cell transistor is arranged in a three-dimensional matrix configuration; and each of the memory cell transistors functions as a memory cell MC that stores data by storing charge in the memory layer.

Although four electrode films 61 are illustrated in FIG. 1 and FIG. 2, the number of the electrode films 61 provided in the stacked body ML is arbitrary.

The portion of the semiconductor pillar SP piercing the stacked body ML and the portion of the semiconductor pillar SP piercing the selection gate electrode SG may be a continuously-formed semiconductor layer; the portion of the semiconductor pillar SP piercing the stacked body ML and the portion of the semiconductor pillar SP piercing the selection gate electrode SG may be formed by separate processes; and these portions may be electrically connected.

As illustrated in FIG. 2, an insulating film 15a may be provided under the electrode film 61 of the lowermost portion of the stacked body ML (e.g., on the side most proximal to the substrate 11). The insulating film 15a may be included in the stacked body ML. An insulating film 15 may be provided on the electrode film 61 of the uppermost portion of the stacked body ML (e.g., on the side most distal to the substrate 11). The insulating film 15 may be included in the stacked body ML. The insulating film 15 and the insulating film 15a may include, for example, silicon oxide. However, this embodiment is not limited thereto. The materials of the insulating films 15 and 15a are arbitrary.

An inter-layer insulating film 16, for example, may be provided between the stacked body ML and the selection gate electrode SG.

As illustrated in FIG. 2, an inter-layer insulating film 17 is provided to divide the selection gate electrodes SG from each other along the Y-axis direction. The inter-layer insulating film 17 extends along the X-axis direction.

An inter-layer insulating film 18 is provided on the inter-layer insulating film 17; and a source line SL (a second interconnect WR2) and a contact electrode 22 are provided thereon. An inter-layer insulating film 19 is provided around the source line SL.

An inter-layer insulating film 23 is provided on the source lines SL; and bit lines BL (first interconnects WR1) are provided thereon. The bit lines BL have, for example, band configurations along the Y-axis direction. The inter-layer insulating films 16, 17, 18, 19, and 23 may include, for example, silicon oxide.

In the nonvolatile semiconductor memory device 110, two of the semiconductor pillars SP are connected on the semiconductor substrate 11 side.

In other words, the nonvolatile semiconductor memory device 110 further includes a semiconductor connection portion SC to electrically connect a first semiconductor pillar SP1 to a second semiconductor pillar SP2 on the semiconductor substrate 11 side. The semiconductor connection portion SC may include, for example, the material used to form the semiconductor pillar SP.

However, as described below, each of the semiconductor pillars SP may be independent; and the semiconductor pillars SP may not be connected to each other. Hereinbelow, the case is described where two of the semiconductor pillars SP are connected.

As described below, the conductive pillar PBG is provided in the interior of each of the semiconductor pillars SP with an interposed insulating layer. A core connection portion CBG is provided in the interior of the semiconductor connection portion SC with an interposed insulating layer. The core connection portion CBG is electrically connected to two of the conductive pillars PBG on the substrate 11 side. The core connection portion CBG may be provided as necessary and may be omitted in some cases. Hereinbelow, the case is described where the core connection portion CBG is provided.

As illustrated in FIG. 1, for example, the second semiconductor pillar SP2 is arranged with the first semiconductor pillar SP1 in the Y-axis direction. A third semiconductor pillar SP3 is arranged with the second semiconductor pillar SP2 in the Y-axis direction on the side of the second semiconductor pillar SP2 opposite to the first semiconductor pillar SP1. A fourth semiconductor pillar SP4 is arranged with the third semiconductor pillar SP3 in the Y-axis direction on the side of the third semiconductor pillar SP3 opposite to the second semiconductor pillar SP2.

The first semiconductor pillar SP1 and the second semiconductor pillar SP2 connected by a first semiconductor connection portion SC1 are used as a pair to form one NAND string having a U-shaped configuration; and the third semiconductor pillar SP3 and the fourth semiconductor pillar SP4 connected by a second semiconductor connection portion SC2 are used as a pair to form another NAND string having a U-shaped configuration.

As illustrated in FIG. 3, the electrode films 61 pierced by the first semiconductor pillar SP1 and the fourth semiconductor pillar SP4 are commonly connected to form an electrode film 61A. The electrode films 61 pierced by the second semiconductor pillar SP2 and the third semiconductor pillar SP3 are commonly connected to form an electrode film 61B. In other words, the electrode films 61 have a configuration in which the electrode film 61A and the electrode film 61B are combined with each other in comb teeth configurations opposing in the X-axis direction.

As illustrated in FIG. 3, the electrode film 61A and the electrode film 61B are divided from each other by an insulating layer IL.

In the interconnect connection unit MU2 as illustrated in FIG. 2, the electrode film 61B is connected at one X-axis direction end to a word interconnect 32 by a contact electrode 31 and is electrically connected to, for example, a drive circuit provided on the semiconductor substrate 11. Similarly, the electrode film 61A is connected at the other X-axis direction end to the word interconnect by the contact electrode and is electrically connected to the drive circuit (not illustrated in FIG. 2). In other words, the length in the X-axis direction of each of the electrode films 61 (the electrode films 61A and the electrode films 61B) stacked in the Z-axis direction changes in a stairstep configuration; and the electrode films 61 are electrically connected to the drive circuit by the electrode films 61A at one X-axis direction end and by the electrode films 61B at the other X-axis direction end. Although each of the electrode films 61 is connected to the contact electrode 31 at the same Y-axis direction position in FIG. 2, the contact electrode 31 corresponding to each of the electrode films 61 may be provided at a different position in Y-axis direction.

Thereby, for the electrode films 61 at the same distance from the semiconductor substrate 11, different potentials can be set for the pair of the first semiconductor pillar SP1 and the second semiconductor pillar SP2. Thereby, the memory cells MC of the same layer corresponding to the first semiconductor pillar SP1 and the second semiconductor pillar SP2 can be operated independently from each other. This is similar for the third semiconductor pillar SP3 and the fourth semiconductor pillar SP4.

A connection portion conductive layer SCC is connected to, for example, a connection portion conductive layer interconnect 34 by a contact electrode 33.

As illustrated in FIG. 1 and FIG. 2, each of the ends of the semiconductor pillars SP opposite to the semiconductor connection portion SC is connected to the bit line BL or the source line SL; and the selection gate electrode SG (first to fourth selection gate electrodes SG1 to SG4) is provided for each of the semiconductor pillars SP. Thereby, the desired data can be programmed to and read from any of the memory cells MC of any of the semiconductor pillars SP.

The number of the semiconductor pillars SP provided in each of the electrode films 61 is arbitrary.

FIG. 4 illustrates the configuration of the matrix memory cell unit MU1 and is a cross-sectional view corresponding to, for example, a portion of the cross section along line B1-B2 of FIG. 1.

The circuit unit CU is not illustrated in FIG. 4.

As illustrated in FIG. 4, the nonvolatile semiconductor memory device 110 includes the stacked body ML (a first stacked body ML1), the conductive pillar PBG (a first conductive pillar PBG1), an inner insulating film 49 (a first pillar inner insulating film 49p1), the semiconductor pillar SP (the first semiconductor pillar SP1), an intermediate insulating film 42 (a first pillar intermediate insulating film 42p1), a memory layer 48 (a first pillar memory layer 48p1), and an outer insulating film 43 (a first pillar outer insulating film 43p1).

The first stacked body ML1 includes multiple first electrode films 61a stacked in the first direction (the Z-axis direction) and a first inter-electrode insulating film 62a provided between the multiple first electrode films 61a.

The first conductive pillar PBG1 pierces the first stacked body ML1 in the first direction. The first pillar inner insulating film 49p1 is provided between the first conductive pillar PBG1 and the first electrode films 61a. The first pillar inner insulating film 49p1 is provided around a side face of the first conductive pillar PBG1. The first semiconductor pillar SP1 is provided between the first pillar inner insulating film 49p1 and the first electrode films 61a to pierce the first stacked body ML1 in the first direction. The first semiconductor pillar SP1 is provided around a side face of the first pillar inner insulating film 49p1. The first pillar intermediate insulating film 42p1 is provided between the first semiconductor pillar SP1 and the first electrode films 61a. The first pillar intermediate insulating film 42p1 is provided around a side face of the first semiconductor pillar SP1. The first pillar memory layer 48p1 is provided between the first pillar intermediate insulating film 42p1 and the first electrode films 61a. The first pillar memory layer 48p1 is provided around a side face of the first pillar intermediate insulating film 42p1. The first pillar outer insulating film 43p1 is provided between the first pillar memory layer 48p1 and the first electrode films 61a. The first pillar outer insulating film 43p1 is provided around a side face of the first pillar memory layer 48p1.

For example, the first pillar inner insulating film 49p1 surrounds the side face of the first conductive pillar PBG1. The first semiconductor pillar SP1 surrounds the side face of the first pillar inner insulating film 49p1. The first pillar intermediate insulating film 42p1 surrounds the side face of the first semiconductor pillar SP1. The first pillar memory layer 48p1 surrounds the side face of the first pillar intermediate insulating film 42p1. The first pillar outer insulating film 43p1 surrounds the side face of the first pillar memory layer 48p1.

The first pillar inner insulating film 49p1 extends between the first conductive pillar PBG1 and the first inter-electrode insulating film 62a; the first pillar intermediate insulating film 42p1 extends between the first semiconductor pillar SP1 and the first inter-electrode insulating film 62a; the first pillar memory layer 48p1 extends between the first pillar intermediate insulating film 42p1 and the first inter-electrode insulating film 62a; and the first pillar outer insulating film 43p1 extends between the first pillar memory layer 48p1 and the first inter-electrode insulating film 62a.

The side face of the first conductive pillar PBG1, the side face of the first pillar inner insulating film 49p1, the side face of the first semiconductor pillar SP1, the side face of the first pillar intermediate insulating film 42p1, the side face of the first pillar memory layer 48p1, and the side face of the first pillar outer insulating film 43p1 are faces parallel to the Z-axis direction.

The nonvolatile semiconductor memory device 110 further includes a second stacked body ML2, a second conductive pillar PBG2, the second pillar inner insulating film 49p2, the second semiconductor pillar SP2, a second pillar intermediate insulating film 42p2, a second pillar memory layer 48p2, a second pillar outer insulating film 43p2, and the semiconductor connection portion SC (the first semiconductor connection portion SC1).

The second stacked body ML2 is arranged with the first stacked body ML1 in the second direction (the Y-axis direction) perpendicular to the first direction (the Z-axis direction). The second stacked body ML2 includes multiple second electrode films 61b stacked in the first direction and a second inter-electrode insulating film 62b provided between the multiple second electrode films 61b.

Each of the multiple first electrode films 61a and each of the multiple second electrode films 61b are in the same layer, respectively. In other words, the distance from the substrate 11 to each of the multiple first electrode films 61a is the same as the distance from the substrate 11 to each of the multiple second electrode films 61b, respectively. The distance from the substrate 11 to each of the multiple first inter-electrode insulating films 62a is the same as the distance from the substrate 11 to each of the multiple second inter-electrode insulating films 62b, respectively.

The second conductive pillar PBG2 pierces the second stacked body ML2 in the first direction. A second pillar inner insulating film 49p2 is provided between the second conductive pillar PBG2 and the second electrode films 61b. The second pillar inner insulating film 49p2 is provided around a side face of the second conductive pillar PBG2. The second semiconductor pillar SP2 is provided between the second pillar inner insulating film 49p2 and the second electrode films 61b to pierce the second stacked body ML2 in the first direction. The second semiconductor pillar SP2 is provided around a side face of the second pillar inner insulating film 49$p$2. The second pillar intermediate insulating film 42$p$2 is provided between the second semiconductor pillar SP2 and the second electrode films 61$b$. The second pillar intermediate insulating film 42$p$2 is provided around a side face of the second semiconductor pillar SP2. The second pillar memory layer 48$p$2 is provided between the second pillar intermediate insulating film 42$p$2 and the second electrode films 61$b$. The second pillar memory layer 48$p$2 is provided around a side face of the second pillar intermediate insulating film 42$p$2. The second pillar outer insulating film 43$p$2 is provided between the second pillar memory layer 48$p$2 and the second electrode films 61$b$. The second pillar outer insulating film 43$p$2 is provided around a side face of the second pillar memory layer 48$p$2.

For example, the second pillar inner insulating film 49$p$2 surrounds the side face of the second conductive pillar PBG2. The second semiconductor pillar SP2 surrounds the side face of the second pillar inner insulating film 49$p$2. The second pillar intermediate insulating film 42$p$2 surrounds the side face of the second semiconductor pillar SP2. The second pillar memory layer 48$p$2 surrounds the side face of the second pillar intermediate insulating film 42$p$2. The second pillar outer insulating film 43$p$2 surrounds the side face of the second pillar memory layer 48$p$2.

The second pillar inner insulating film 49$p$2 extends between the second conductive pillar PBG2 and the second inter-electrode insulating film 62$b$; the second pillar intermediate insulating film 42$p$2 extends between the second semiconductor pillar SP2 and the second inter-electrode insulating film 62$b$; the second pillar memory layer 48$p$2 extends between the second pillar intermediate insulating film 42$p$2 and the second inter-electrode insulating film 62$b$; and the second pillar outer insulating film 43$p$2 extends between the second pillar memory layer 48$p$2 and the second inter-electrode insulating film 62$b$.

The side face of the second conductive pillar PBG2, the side face of the second pillar inner insulating film 49$p$2, the side face of the second semiconductor pillar SP2, the side face of the second pillar intermediate insulating film 42$p$2, the side face of the second pillar memory layer 48$p$2, and the side face of the second pillar outer insulating film 43$p$2 are faces parallel to the Z-axis direction.

The semiconductor connection portion SC (the first semiconductor connection portion SC1) electrically connects one end of the first semiconductor pillar SP1 to one end of the second semiconductor pillar SP2.

The nonvolatile semiconductor memory device 110 further includes the core connection portion CBG (a first core connection portion CBG1) and a connection portion inner insulating film 49$c$ (a first connection portion inner insulating film 49$c$1). However, the core connection portion CBG and the connection portion inner insulating film 49$c$ may be provided as necessary and may be omitted in some cases. Hereinbelow, the case is described where the core connection portion CBG and the connection portion inner insulating film 49$c$ are provided.

The core connection portion CBG (the first core connection portion CBG1) electrically connects an end (e.g., the lower end) of the first conductive pillar PBG1) to an end (e.g., the lower end) of the second conductive pillar PBG2.

The connection portion inner insulating film 49$c$ (the first connection portion inner insulating film 49$c$1) is provided between the semiconductor connection portion SC (the first semiconductor connection portion SC1) and the core connection portion CBG (the first core connection portion CBG1).

The core connection portion CBG (the first core connection portion CBG1) extends, for example, in the X-Y plane. The semiconductor connection portion SC (the first semiconductor connection portion SC1) extends, for example, in the X-Y plane. The semiconductor connection portion SC (the first semiconductor connection portion SC1) is provided around a side face of the core connection portion CBG (the first core connection portion CBG1). For example, the semiconductor connection portion SC (the first semiconductor connection portion SC1) surrounds the side face of the core connection portion CBG (the first core connection portion CBG1). The side face of the core connection portion CBG (the first core connection portion CBG1) is a face perpendicular to the Z-axis direction.

The nonvolatile semiconductor memory device 110 further includes the connection portion conductive layer SCC, a connection portion intermediate insulating film (a first connection portion intermediate insulating film 42$c$1), a connection portion memory layer (a first connection portion memory layer 48$c$1), and a connection portion outer insulating film (a first connection portion outer insulating film 43$c$1).

The connection portion conductive layer SCC is provided to oppose the semiconductor connection portion SC (the first semiconductor connection portion SC1). The connection portion intermediate insulating film (the first connection portion intermediate insulating film 42$c$1) is provided between the semiconductor connection portion SC (the first semiconductor connection portion SC1) and the connection portion conductive layer SCC. The connection portion memory layer (the first connection portion memory layer 48$c$1) is provided between the connection portion intermediate insulating film (the first connection portion intermediate insulating film 42$c$1) and the connection portion conductive layer SCC. The connection portion outer insulating film (the first connection portion outer insulating film 43$c$1) is provided between the connection portion memory layer (the first connection portion memory layer 48$c$1) and the connection portion conductive layer SCC.

A memory cell transistor is formed at the portion where the electrode films 61 (the first electrode films 61$a$ and the second electrode films 61$b$) and the semiconductor pillars SP (the first semiconductor pillar SP1 and the second semiconductor pillar SP2) intersect; and each of the memory cell transistors forms a memory cell MC.

A prescribed electrical signal is applied to the electrode films 61; and the electrode films 61 function as, for example, word electrodes of the nonvolatile semiconductor memory device 110.

In each of the memory cells MC, the memory layer 48 (the first pillar memory layer 48$p$1 and the second pillar memory layer 48$p$2) stores or release a charge by an electric field applied between the semiconductor pillar SP and the electrode film 61 such that the memory layer 48 functions as a portion storing information. In other words, the memory layer 48 (the first pillar memory layer 48$p$1 and the second pillar memory layer 48$p$2) functions as a charge storage layer.

The intermediate insulating film 42 (the first pillar intermediate insulating film 42$p$1 and the second pillar intermediate insulating film 42$p$2) functions as, for example, a tunnel insulating film of each of the memory cells MC.

The outer insulating film 43 (the first pillar outer insulating film 43$p$1 and the second pillar outer insulating film 43$p$2) functions as, for example, a block insulating layer of each of the memory cells MC.

A connection portion memory layer 48$c$ (the first connection portion memory layer 48$c$1) may include the same material as, for example, the material of the first pillar memory layer 48*p*1 and the second pillar memory layer 48*p*2. The connection portion memory layer 48*c* (the first connection portion memory layer 48*c*1) may be formed simultaneously with, for example, the first pillar memory layer 48*p*1 and the second pillar memory layer 48*p*2.

The first connection portion intermediate insulating film 42*c*1 may include, for example, the same material as the material of the first pillar intermediate insulating film 42*p*1 and the second pillar intermediate insulating film 42*p*2. The first connection portion intermediate insulating film 42*c*1 may be formed, for example, simultaneously with the first pillar intermediate insulating film 42*p*1 and the second pillar intermediate insulating film 42*p*2.

The first connection portion outer insulating film 43*c*1 may include, for example, the same material as the material of the first pillar outer insulating film 43*p*1 and the second pillar outer insulating film 43*p*2. The first connection portion outer insulating film 43*c*1 may be formed, for example, simultaneously with the first pillar outer insulating film 43*p*1 and the second pillar outer insulating film 43*p*2.

By applying a voltage to the connection portion conductive layer SCC, the semiconductor connection portion SC (the first semiconductor connection portion SC1) electrically connects the first semiconductor pillar SP1 to the second semiconductor pillar SP2.

The portion where the connection portion conductive layer SCC and the first semiconductor connection portion SC1 oppose each other may be utilized as a memory cell MC that includes the first connection portion memory layer 48*c*1 as a charge storage layer. In other words, the connection portion memory layer 48*c* (the first connection portion memory layer 48*c*1) functions as a portion that stores information by, for example, storing and releasing a charge by an electric field applied between the semiconductor connection portion SC and the connection portion conductive layer SCC.

The electrode films 61 (the first electrode films 61*a* and the second electrode films 61*b*) and the connection portion conductive layer SCC may include any conductive material. For example, amorphous silicon provided with conductivity by introducing an impurity or polysilicon provided with conductivity by introducing an impurity may be used. Or, the electrode films 61 may include metals, alloys, etc.

The inter-electrode insulating film 62 (the first inter-electrode insulating film 62*a* and the second inter-electrode insulating film 62*b*), the intermediate insulating film 42 (the first pillar intermediate insulating film 42*p*1, the second pillar intermediate insulating film 42*p*2, and the first connection portion intermediate insulating film 42*c*1), and the outer insulating film 43 (the first pillar outer insulating film 43*p*1, the second pillar outer insulating film 43*p*2, and the first connection portion outer insulating film 43*c*1) may include, for example, silicon oxide. These films may be single-layer films or stacked films.

The memory layer 48 (the first pillar memory layer 48*p*1, the second pillar memory layer 48*p*2, and the first connection portion memory layer 48*c*1) may include, for example, silicon nitride. The memory layer 48 may be a single-layer film or a stacked film.

The inter-electrode insulating film 62, the intermediate insulating film 42, the outer insulating film 43, and the memory layer 48 are not limited to the materials described above. Any material may be used.

In the nonvolatile semiconductor memory device 110, the conductive pillar PBG (the first conductive pillar PBG1 and the second conductive pillar PBG2) functions as, for example, the back gate of the memory cell transistor of the memory cell MC of the portion where the electrode films 61 and the semiconductor pillar SP intersect. The core connection portion CBG (the first core connection portion CBG1) functions, for example, as the back gate of the memory cell transistor of the memory cell MC of the portion where the connection portion conductive layer SCC and the semiconductor connection portion SC oppose each other.

The first conductive pillar PBG1, the second conductive pillar PBG2, and the core connection portion CBG (the first core connection portion CBG1) may include any conductive material. The first conductive pillar PBG1, the second conductive pillar PBG2, and the core connection portion CBG (the first core connection portion CBG1) may include, for example, amorphous silicon provided with conductivity by introducing an impurity or polysilicon provided with conductivity by introducing an impurity. Or, the first conductive pillar PBG1, the second conductive pillar PBG2, and the core connection portion CBG (the first core connection portion CBG1) may include metals, alloys, etc. However, from the viewpoint of the process suitability (including, for example, the heat resistance), it is desirable for the first conductive pillar PBG1, the second conductive pillar PBG2, and the core connection portion CBG (the first core connection portion CBG1) to include amorphous silicon or polysilicon.

The first pillar inner insulating film 49*p*1, the second pillar inner insulating film 49*p*2, and the connection portion inner insulating film 49*c* (the first connection portion inner insulating film 49*c*1) may include, for example, silicon oxide. The first pillar inner insulating film 49*p*1, the second pillar inner insulating film 49*p*2, and the connection portion inner insulating film 49*c* (the first connection portion inner insulating film 49*c*1) may be a single-layer film or a stacked film.

The nonvolatile semiconductor memory device 110 further includes the first selection gate electrode SG1, the second selection gate electrode SG2, the first interconnect WR1 (the bit line BL), the second interconnect the WR2 (the source line SL), and a third interconnect WR3 (a back gate line BGL).

The first selection gate electrode SG1 is stacked with the first stacked body ML1 in the first direction. The first selection gate electrode SG1 is pierced by the first semiconductor pillar SP1.

The second selection gate electrode SG2 is stacked with the second stacked body ML2 in the first direction. The second selection gate electrode SG2 is pierced by the second semiconductor pillar SP2.

The bit line BL is electrically connected to another end of the first semiconductor pillar SP1 (the end on the side opposite to the semiconductor connection portion SC, i.e., the first semiconductor connection portion SC1).

The bit line BL is electrically connected to the other end of the first semiconductor pillar SP1 via a contact electrode 22*a* on the first selection gate electrode SG1 side and a contact electrode 24*a* on the bit line BL side. The contact electrode 22*a* and the contact electrode 24*a* correspond to the contact electrode 22 illustrated in FIG. 2 (a contact electrode VA1 illustrated in FIG. 1).

The source line SL is electrically connected to the other end of the second semiconductor pillar SP2 (the end on the side opposite to the semiconductor connection portion SC, i.e., the first semiconductor connection portion SC1).

The source line SL is electrically connected to the other end of the second semiconductor pillar SP2 via a contact electrode 22*b*.

The back gate line BGL is electrically connected to at least one selected from one end of the first conductive pillar PBG1 (the end on the side opposite to the core connection portion CBG, i.e., the first core connection portion CBG1, e.g., the upper end) and one end of the second conductive pillar PBG2

(the end on the side opposite to the core connection portion CBG, i.e., the first core connection portion CBG1, e.g., the upper end).

In the case where, for example, the first conductive pillar PBG1 and the second conductive pillar PBG2 are connected by the core connection portion CBG (the first core connection portion CBG1), the back gate line BGL may be connected to either the first conductive pillar PBG1 or the second conductive pillar PBG2 or to both. Hereinbelow, the case is described where the back gate line BGL is electrically connected to the one end of the first conductive pillar PBG1 and the one end of the second conductive pillar PBG2.

The third interconnect (the back gate line BGL) is provided on the side of the first interconnect WR1 (in this example, the bit line BL) opposite to the first stacked body ML1. The first conductive pillar PBG1 pierces the first interconnect WR1 along the first direction. Namely, at least a part of the bit line BL is disposed between the back gate line BGL and the first stacked body ML1.

The third interconnect (the back gate line BGL) is further provided on the side of the second interconnect WR2 (in this case, the source line SL) opposite to the second stacked body ML2. The second conductive pillar PBG2 pierces the second interconnect WR2 along the first direction. Namely, at least a part of the source line SL is disposed between the back gate line BGL and the second stacked body ML2.

The back gate line BGL is electrically connected to another end of the first conductive pillar PBG1 via a contact electrode BGCaa on the first selection gate electrode SG1 side, a contact electrode BGCab piercing the bit line BL, and a contact electrode BGCac on the back gate line BGL side. A contact electrode portion insulating layer BGIaa is provided between the contact electrode BGCaa and the contact electrode $22a$; and a contact electrode portion insulating layer BGIab is provided between the contact electrode BGCab and the contact electrode $24a$.

On the other hand, the back gate line BGL is electrically connected to the other end of the second conductive pillar PBG2 via a contact electrode BGCba piercing the source line SL, a contact electrode BGCbb piercing the bit line BL, and a contact electrode BGCbc on the back gate line BGL side. A contact electrode portion insulating layer BGIba is provided between the contact electrode BGCba and the contact electrode $22b$; and a contact electrode portion insulating layer BGIbb is provided between the contact electrode BGCbb and the bit line BL.

The contact electrode $22a$ and the contact electrode $24a$ may be provided integrally with the first semiconductor pillar SP1 by extending the first semiconductor pillar SP1. The contact electrode $22a$ and the contact electrode $24a$ may be provided separately from the first semiconductor pillar SP1.

The contact electrode $22b$ may be provided integrally with the second semiconductor pillar SP2 by extending the second semiconductor pillar SP2. The contact electrode $22b$ may be provided separately from the second semiconductor pillar SP2.

The contact electrode BGCaa, the contact electrode BGCab, and the contact electrode BGCac may be provided integrally with the first conductive pillar PBG1 by extending the first conductive pillar PBG1. The contact electrode BGCaa, the contact electrode BGCab, and the contact electrode BGCac may be provided separately from the first conductive pillar PBG1.

The contact electrode BGCba, the contact electrode BGCbb, and the contact electrode BGCbc may be provided integrally with the second conductive pillar PBG2 by extending the second conductive pillar PBG2. The contact electrode BGCba, the contact electrode BGCbb, and the contact electrode BGCbc may be provided separately from the second conductive pillar PBG2.

At least a portion of the contact electrode portion insulating layer BGIaa and the contact electrode portion insulating layer BGIab may be provided integrally with the first pillar inner insulating film $49p1$ by extending the first pillar inner insulating film $49p1$. At least a portion of the contact electrode portion insulating layer BGIaa and the contact electrode portion insulating layer BGIab may be provided separately from the first pillar inner insulating film $49p1$.

At least a portion of the contact electrode portion insulating layer BGIba and the contact electrode portion insulating layer BGIbb may be provided integrally with the second pillar inner insulating film $49p2$ by extending the second pillar inner insulating film $49p2$. At least a portion of the contact electrode portion insulating layer BGIba and the contact electrode portion insulating layer BGIbb may be provided separately from the second pillar inner insulating film $49p2$.

The first electrode films $61a$ and the second electrode films $61b$ extend in the third direction (the X-axis direction) perpendicular to the first direction (the Z-axis direction) and the second direction (the Y-axis direction). For example, the first electrode films $61a$ and the second electrode films $61b$ have portions extending along the X-axis direction. The bit line BL extends in the Y-axis direction. For example, the bit line BL has a portion extending along the Y-axis direction. The source line SL extending in the X-axis direction. For example, the source line SL has a portion extending along the X-axis direction.

The first selection gate electrode SG1 and the second selection gate electrode SG2 have portions extending along the X-axis direction. In other words, the first selection gate electrode SG1 and the second selection gate electrode SG2 extend along directions parallel to the extending directions of the first electrode films $61a$ and the second electrode films $61b$.

The selection gate electrode SG (the first selection gate electrode SG1 and the second selection gate electrode SG2) may include any conductive material. The selection gate electrode SG may include, for example, amorphous silicon provided with conductivity by introducing an impurity or polysilicon provided with conductivity by introducing an impurity. Or, the selection gate electrode SG may include metals, alloys, etc.

A selection gate insulating film SGI is provided between the selection gate electrode SG and the semiconductor pillar SP.

In other words, the nonvolatile semiconductor memory device 110 further includes the first selection gate electrode SG1 pierced by the first semiconductor pillar SP1 and stacked with the first stacked body ML1 along the Z-axis direction, a first selection gate insulating film SGI1 provided between the first selection gate electrode SG1 and the first semiconductor pillar SP1, the second selection gate electrode SG2 pierced by the second semiconductor pillar SP2 and stacked with the second stacked body ML2 along the Z-axis direction, and the second selection gate insulating film SGI2 provided between the second selection gate electrode SG2 and the second semiconductor pillar SP2.

The stacked film of the intermediate insulating film 42, the memory layer 48, and the outer insulating film 43 may be used as the selection gate insulating film SGI (the first selection gate insulating film SGI1 and a second selection gate insulating film SGI2); and an insulating film different from the stacked film of the intermediate insulating film 42, the memory layer 48, and the outer insulating film 43 may be used. The selection gate insulating film SGI may be a single-layer film or a stacked film.

A first selection gate transistor SGT1 is formed at the portion where the selection gate electrode SG and the first semiconductor pillar SP1 intersect; and a second selection gate transistor SGT2 is formed at the portion where the selection gate electrode SG and the second semiconductor pillar SP2 intersect. The selection gate insulating film SGI functions as the gate insulating film of these selection gate transistors. These selection gate transistors have the function of selecting the semiconductor pillars SP.

As illustrated in FIG. 1, the nonvolatile semiconductor memory device 110 further includes the third semiconductor pillar SP3, the fourth semiconductor pillar SP4, and the second semiconductor connection portion SC2. The nonvolatile semiconductor memory device 110 further includes a third conductive pillar PBG3 (not illustrated), a fourth conductive pillar PBG4 (not illustrated), and a second core connection portion CBG2 (not illustrated).

The configurations described in regard to the first semiconductor pillar SP1, the second semiconductor pillar SP2, the first semiconductor connection portion SC1, the first conductive pillar PBG1, the second conductive pillar PBG2, and the first core connection portion CBG1 can be applied to third semiconductor pillar SP3, the fourth semiconductor pillar SP4, the second semiconductor connection portion SC2, the third conductive pillar PBG3, the fourth conductive pillar PBG4, and the second core connection portion CBG2, respectively.

In other words, the third semiconductor pillar SP3 pierces a third stacked body along the Z-axis direction. The fourth semiconductor pillar SP4 pierces a fourth stacked body along the Z-axis direction. The third conductive pillar PBG3 is provided in the interior of the third semiconductor pillar SP3. The fourth conductive pillar PBG4 is provided in the interior of the fourth semiconductor pillar SP4.

The second semiconductor connection portion SC2 electrically connects one end of the third semiconductor pillar SP3 to one end of the fourth semiconductor pillar SP4. The second core connection portion CBG2 electrically connects an end (e.g., the lower end) of the third conductive pillar PBG3 to an end (e.g., the lower end) of the fourth conductive pillar PBG4.

As described in regard to FIG. 3, the electrode film 61 pierced by the third semiconductor pillar SP3 is continuous with the second electrode film 61b pierced by the second semiconductor pillar SP2; and the electrode film 61 pierced by the fourth semiconductor pillar SP4 is continuous with the first electrode film 61a pierced by the first semiconductor pillar SP1. However, this embodiment is not limited thereto. Each of the semiconductor pillars SP may pierce different electrode films 61 (e.g., divided along the Y-axis direction).

The first interconnect (the bit line BL) is further connected to, for example, another end of the fourth semiconductor pillar SP4 on the side opposite to the second semiconductor connection portion SC2. The second interconnect (the source line SL) is further connected to another end of the third semiconductor pillar SP3 on the side opposite to the second semiconductor connection portion SC2.

As illustrated in FIG. 1, the first semiconductor pillar SP1 is connected to the bit line BL by the contact electrode VA1; and the fourth semiconductor pillar SP4 is connected to the bit line BL by a contact electrode VA2.

FIG. 5A is a schematic perspective view illustrating the configuration of the semiconductor pillar SP. FIG. 5B is a schematic cross-sectional view illustrating the configuration of the semiconductor pillar SP and is a cross-sectional view when the semiconductor pillar SP is cut by the X-Y plane. In other words, these drawings illustrate the configuration of the memory cell MC (the memory cell transistor).

As illustrated in FIG. 5A, the through-hole TH is provided in the electrode films 61; the first conductive pillar PBG1 is provided in the through-hole TH; the first pillar inner insulating film 49p1 is provided to surround a side face of the first conductive pillar PBG1; the first semiconductor pillar SP1 is provided to surround a side face of the first pillar inner insulating film 49p1; the first pillar intermediate insulating film 42p1 is provided to surround a side face of the first semiconductor pillar SP1; the first pillar memory layer 48p1 is provided to surround a side face of the first pillar intermediate insulating film 42p1; and the first pillar outer insulating film 43p1 is provided to surround a side face of the first pillar memory layer 48p1.

Such a configuration is obtained, for example, by forming the materials used to form the first pillar outer insulating film 43p1, the first pillar memory layer 48p1, the first pillar intermediate insulating film 42p1, the first semiconductor pillar SP1, the first pillar inner insulating film 49p1, and the first conductive pillar PBG1 sequentially on the wall face inside the through-hole TH provided in the first stacked body ML1.

As illustrated in FIG. 5B, the cross-sectional configuration (the cross-sectional configuration when cut by the X-Y plane) of the through-hole TH is a configuration having a curve (e.g., circular or flattened circular); and the cross-sectional configuration of the first semiconductor pillar SP1 is a configuration having a curve (e.g., circular or flattened circular). Thereby, the curvature of the first pillar intermediate insulating film 42p1 is greater than the curvature of the first pillar outer insulating film 43p1. Thereby, in the case where a voltage is applied between the first semiconductor pillar SP1 and the first electrode film 61a, the electric field applied to the first pillar intermediate insulating film 42p1 is greater than the electric field applied to the first pillar outer insulating film 43p1.

By utilizing the difference of the electric field, for example, the desired charge (e.g., electrons) can be injected effectively into the first pillar memory layer 48p1 via the first pillar intermediate insulating film 42p1. Or, for example, the desired charge (e.g., holes) can be injected effectively into the first pillar memory layer 48p1 via the first pillar intermediate insulating film 42p1.

Herein, the operation of performing at least one selected from injecting electrons into the memory layer 48 (e.g., the first pillar memory layer 48p1) and ejecting holes from the memory layer 48 (e.g., the first pillar memory layer 48p1) is taken as a programming operation.

Further, the operation of performing at least one selected from injecting holes into the memory layer 48 (e.g., the first pillar memory layer 48p1) and ejecting electrons from the memory layer 48 (e.g., the first pillar memory layer 48p1) is taken as an erasing operation.

In other words, the memory cell transistor forming the memory cell MC has a low threshold value state (the erased state) and a state (the programmed state) in which the threshold value is relatively higher than that of the low threshold value state.

The programming operation is an operation of setting the threshold value of the memory cell transistor to the state on the high side. The erasing operation is an operation of setting the threshold value of the memory cell transistor to the state of the low side.

In the nonvolatile semiconductor memory device 110 according to this embodiment, a stable erasing operation can be realized by providing the conductive pillar PBG (e.g., the first conductive pillar PBG1) in the interior of the semiconductor pillar SP (e.g., the first semiconductor pillar SP1) where the memory cell MC is formed and by utilizing the conductive pillar PBG (e.g., the first conductive pillar PBG1) as a back gate.

For example, in the erasing operation of the nonvolatile semiconductor memory device 110, the voltage applied to the first conductive pillar PBG1 is higher than the voltage applied to the first electrode film 61a. In other words, the first conductive pillar PBG1 is set to a potential higher than the potential applied to the first electrode film 61a. Thereby, for example, at least one selected from injecting holes into the first pillar memory layer 48p1 and ejecting electrons from the first pillar memory layer 48p1 can be implemented effectively and stably.

Such an operation can be implemented by a control unit CTU. In other words, the nonvolatile semiconductor memory device 110 further includes the control unit CTU electrically connected to the multiple first electrode films 61a and the first conductive pillar PBG1. The control unit CTU controls the state of the charge stored in the first pillar memory layer 48p1 of the intersection between the first semiconductor pillar SP1 and each of the multiple first electrode films 61a.

The control unit CTU applies a voltage to the first conductive pillar PBG1 higher than the voltage applied to the first electrode film 61a in the operation of performing at least one selected from injecting holes into the first pillar memory layer 48p1 and ejecting electrons from the first pillar memory layer 48p1.

At least a portion of such a control unit CTU may be provided, for example, in the peripheral region PR described in regard to FIG. 1. At least a portion of the control unit CTU may be provided, for example, in the peripheral region circuit PR1. At least a portion of the control unit CTU may be provided in the circuit unit CU of the memory array region MR. Further, the control unit CTU may be provided as a separate entity from the substrate 11.

Figure 6A:
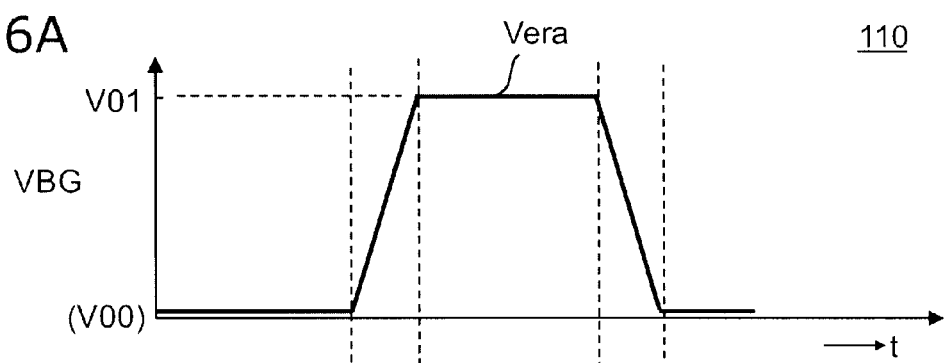
FIG. 6A and FIG. 6B are schematic views illustrating operations of the nonvolatile semiconductor memory device according to the first embodiment.
Figure 6B:
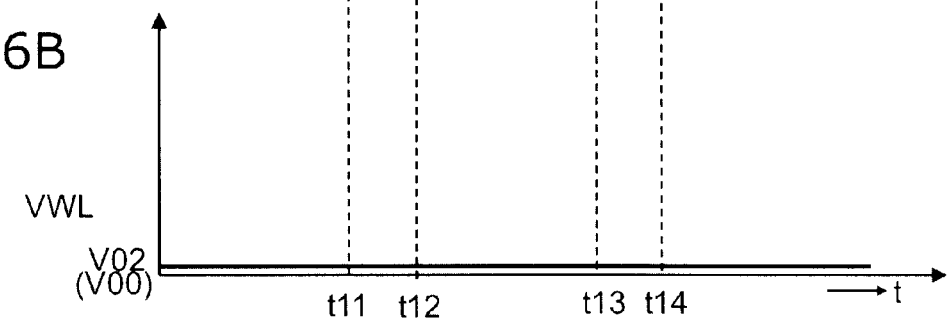

FIG. 6A and FIG. 6B are schematic views illustrating operations of the nonvolatile semiconductor memory device according to the first embodiment.

Namely, these drawings are timing charts of the erasing operation. FIG. 6A illustrates a back gate voltage VBG applied to the conductive pillar PBG (e.g., the first conductive pillar PBG1). The back gate voltage VBG is, for example, the voltage applied to the back gate line BGL. FIG. 6B illustrates a word line voltage VWL applied to the electrode film 61 (e.g., the first electrode film 61a). In these drawings, the horizontal axis corresponds to the time t. The vertical axis of FIG. 6A corresponds to the back gate voltage VBG. The vertical axis of FIG. 6B corresponds to the word line voltage VWL. Such operations may be implemented, for example, by the control unit CTU.

In the erasing operation as illustrated in FIG. 6A and FIG. 6B, the control unit CTU applies a first voltage V01 to the first conductive pillar PBG1 and a second voltage V02 to the first electrode film 61a. The first voltage V01 is a voltage higher than the second voltage V02.

The second voltage V02 is, for example, a reference voltage V00, e.g., 0 volts (0 V). The first voltage V01 is a high voltage of an erasing voltage Vera. The first voltage V01 is, for example, not less than about 10 V and not more than about 20 V.

For example, at times prior to a first time t11, the back gate voltage VBG applied to the first conductive pillar PBG1 is the reference voltage V00. The back gate voltage VBG increases from the reference voltage V00 at the first time t11 to reach the erasing voltage Vera (the first voltage V01) at a second time t12. Subsequently, the back gate voltage VBG starts to decrease at a third time t13 to return to the reference voltage V00 at a fourth time t14.

On the other hand, the word line voltage VWL is constant at the second voltage V02 (the reference voltage V00).

Thereby, the erasing operation of performing at least one selected from injecting holes into the first pillar memory layer 48p1 and ejecting electrons from the first pillar memory layer 48p1 can be stably implemented.

In the erasing operation recited above, for example, a high voltage of the first voltage V01 may be applied to the bit line BL connected to the first semiconductor pillar SP1 and the source line SL connected to the second semiconductor pillar SP2; or a voltage between the first voltage V01 and the second voltage V02 may be applied. Or, the bit line BL and the source line SL may be, for example, in floating states.

In the erasing operation recited above, for example, a voltage between the first voltage V01 and the second voltage V02 is applied to the first selection gate electrode SG1 and the second selection gate electrode SG2. A voltage between the first voltage V01 and the second voltage V02, for example, is applied to the connection portion conductive layer SCC.

Thereby, the erasing operation can be implemented appropriately.

In the case where, for example, the first conductive pillar PBG1 and the second conductive pillar PBG2 are not provided, it is difficult to perform the erasing operation in some cases. In other words, in the case of such a configuration, the erasing operation is performed by applying an erasing voltage, which is higher than the voltage applied to the electrode film 61, to the semiconductor pillar that corresponds to the semiconductor pillar. A limitation arises that the erasing voltage must be, for example, a voltage at which dielectric breakdown of the selection gate insulating film SGI of the selection gate transistor does not occur. Because the voltage is supplied to the semiconductor pillar from the selection gate electrode SG side, it is difficult to apply a uniform voltage over the entire semiconductor pillar; and it is difficult to perform a uniform erasing.

Conversely, in the nonvolatile semiconductor memory device 110 according to this embodiment, the first conductive pillar PBG1 and the second conductive pillar PBG2 are provided and used as the back gate. Therefore, the limitation relating to the dielectric breakdown of the selection gate insulating film SGI is removed; a uniform erasing voltage can be applied to the memory cells MC corresponding to the entire semiconductor pillar SP; and it is easy to implement the erasing operation reliably and uniformly.

FIG. 7A, FIG. 7B, FIG. 7C, and FIG. 7D are schematic views illustrating the operations of the nonvolatile semiconductor memory device according to the first embodiment.

Namely, these drawings are timing charts of the programming operation. FIG. 7A illustrates a bit line voltage VBL applied to the bit line BL and a source line voltage VSL applied to the source line SL. FIG. 7B illustrates a selection gate voltage VSG applied to the selection gate electrode SG (the first selection gate electrode SG1 and the second selection gate electrode SG2). FIG. 7C illustrates a selected word line voltage VWLS applied to the electrode film 61 (e.g., the first electrode film 61a) of the selected memory cell to which the programming is performed. FIG. 7D illustrates an unselected word line voltage VWLN applied to the electrode film 61 (e.g., the first electrode film 61a) of the unselected memory cells to which the programming is not performed. In these drawings, the horizontal axis corresponds to the time t. In FIG. 7A, the vertical axis corresponds to the bit line voltage VBL and the source line voltage VSL. In FIG. 7B, the vertical axis corresponds to the selection gate voltage VSG. In FIG. 7C, the vertical axis corresponds to the selected word line voltage VWLS. In FIG. 7D, the vertical axis corresponds to the unselected word line voltage VWLN. Such operations may be implemented by, for example, the control unit CTU.

In the programming operation as illustrated in FIG. 7A to FIG. 7D, the control unit CTU applies a third voltage V03 to the bit line BL and the source line SL, applies a fourth voltage V04 (a programming voltage Vpgm), which is higher than the third voltage V03, to the electrode film 61 (e.g., the first electrode film 61a) of the selected memory cell, and applies a fifth voltage V05 (a pass voltage Vpass), which is higher than the third voltage V03 and lower than the fourth voltage V04, to the electrode film 61 (e.g., the first electrode film 61a) of the unselected memory cells.

Thereby, the programming operation of performing at least one selected from injecting electrons into the memory layer 48 (e.g., the first pillar memory layer 48p1) and ejecting holes from the memory layer 48 (e.g., the first pillar memory layer 48p1) corresponding to the selected memory cell is implemented. Because the fifth voltage V05 (the pass voltage Vpass) applied to the memory layer 48 (e.g., the first pillar memory layer 48p1) corresponding to the unselected memory cells is low, the programming is not performed.

In the programming operation recited above as illustrated in FIG. 7B, a sixth voltage V06 (a selection gate pass voltage VpassG), which is higher than the third voltage V03 and lower than the fourth voltage V04, is applied to the first selection gate electrode SG1 and the second selection gate electrode SG2.

Specifically, the selection gate voltage VSG starts to increase from the reference voltage V00 at a fifth time t15 to reach the sixth voltage V06 (the selection gate pass voltage VpassG) at a sixth time t16. Then, the selection gate voltage VSG starts to decrease at a seventh time t17 to return to the reference voltage V00 at an eighth time t18.

The unselected word line voltage VWLN also starts to increase, for example, from the reference voltage V00 at the fifth time t15 to reach the fifth voltage V05 (the pass voltage Vpass) at the sixth time t16 and starts to decrease at the seventh time t17 to return to the reference voltage V00 at the eighth time t18.

On the other hand, the selected word line voltage VWLS starts to increase, for example, from the reference voltage V00 at or after the fifth time t15 to reach the fourth voltage V04 (the programming voltage Vpgm) at or after the sixth time t16 and starts to decrease at or prior to the seventh time t17 to return to the reference voltage V00 at or prior to the eighth time t18.

In the programming operation recited above, a voltage (e.g., the same voltage as the fifth voltage V05, etc.) which is higher than the third voltage V03 and lower than the fourth voltage V04 may be applied to the first conductive pillar PBG1. Or, the same low voltage as the third voltage V03 may be applied to the first conductive pillar PBG1. Or, the first conductive pillar PBG1 may be in a floating state.

In the programming operation recited above, an intermediate voltage, for example, between the third voltage V03 and the fourth voltage V04 may be applied to the connection portion conductive layer SCC.

In the reading operation, for example, a bit line voltage in the reading (e.g., 1 V to 2 V), which is higher than the third voltage V03 and lower than the fourth voltage V04, is applied to the bit line BL; the third voltage V03 is applied to the source line SL; a low voltage (e.g., 5 V), for example, is applied to the electrode film 61 corresponding to the unselected memory cells; and a sense voltage is applied to the electrode film 61 corresponding to the selected memory cell. At this time, a low voltage (e.g., 5 V), for example, is applied to the connection portion conductive layer SCC. Or, the third voltage V03 (e.g., the reference voltage V00 of 0 V), for example, is applied to the first conductive pillar PBG1.

Second Embodiment

Figure 8:
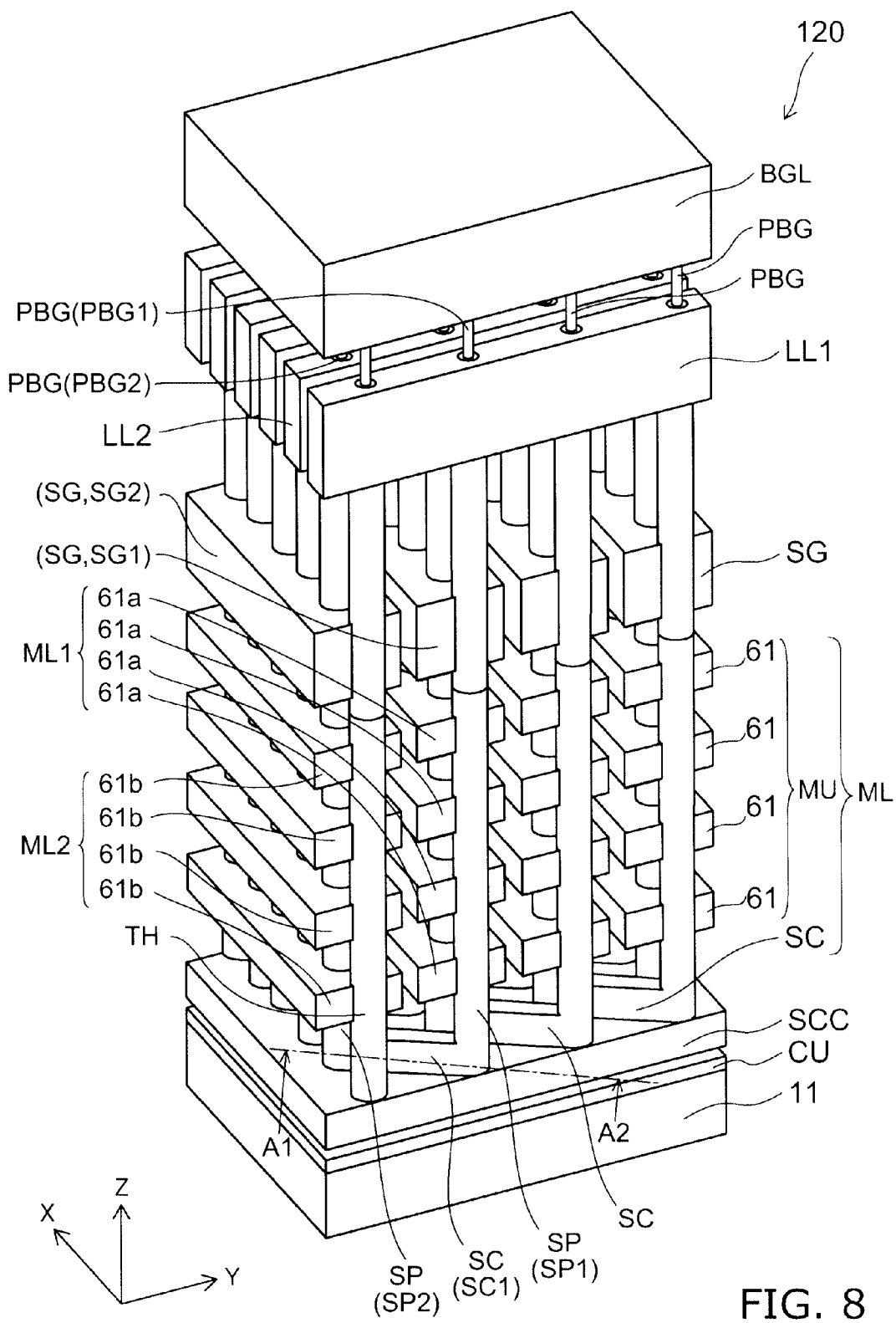
FIG. 8 is a schematic perspective view illustrating a nonvolatile semiconductor memory device according to a second embodiment.

FIG. 8 is a schematic perspective view illustrating the configuration of a nonvolatile semiconductor memory device according to a second embodiment.

For easier viewing of the drawing in FIG. 8, only the conductive portions are illustrated, and the insulating portions are omitted.

Figure 9:
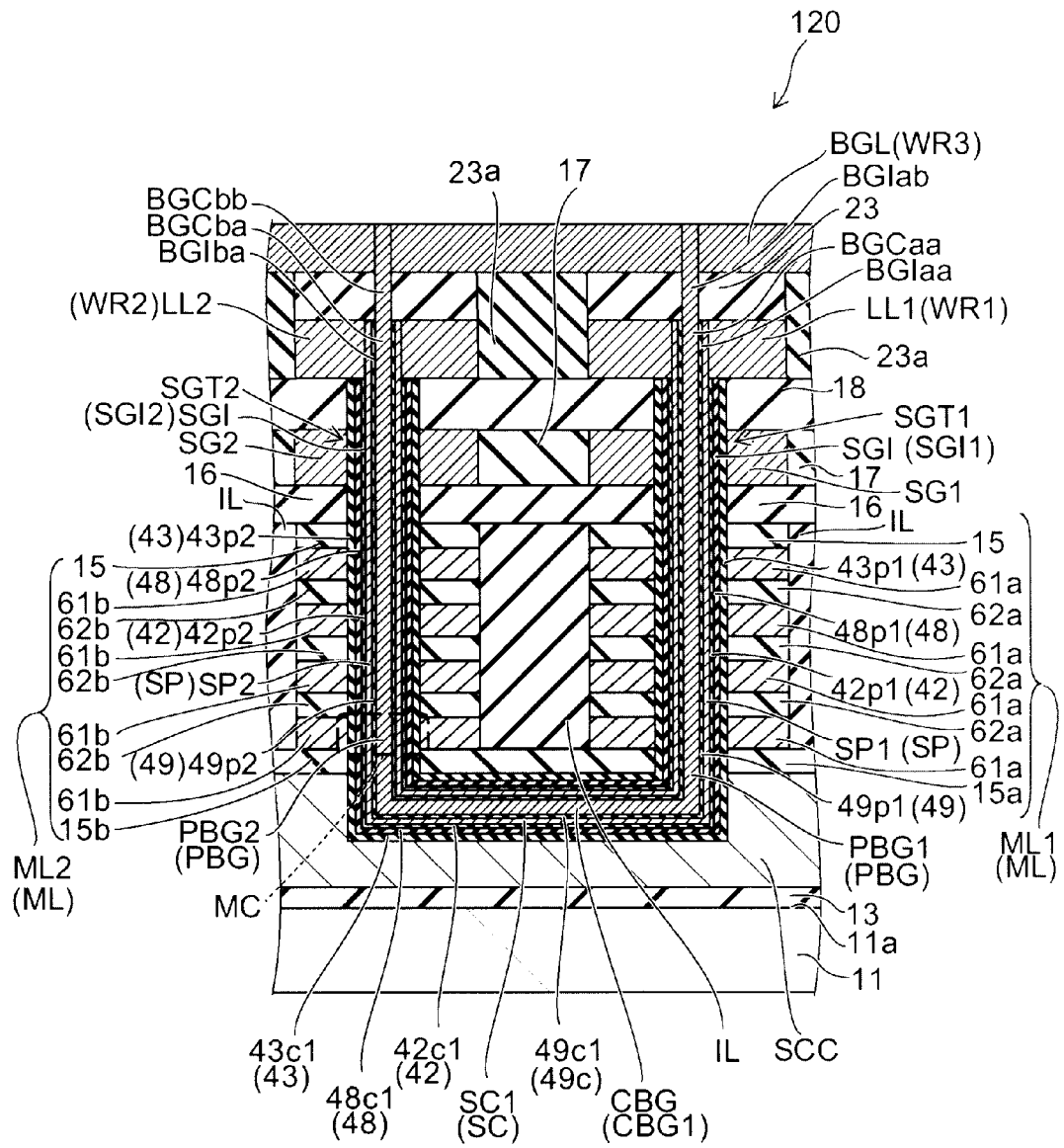
FIG. 9 is a schematic cross-sectional view illustrating a portion of the nonvolatile semiconductor memory device according to the second embodiment.

FIG. 9 is a schematic cross-sectional view illustrating the configuration of a portion of the nonvolatile semiconductor memory device according to the second embodiment.

Namely, FIG. 9 illustrates the configuration of the matrix memory cell unit MU1 and is a cross-sectional view corresponding to, for example, a portion of the cross section along line A1-A2 of FIG. 8.

The circuit unit CU is not illustrated in FIG. 9.

As illustrated in FIG. 8 and FIG. 9, the nonvolatile semiconductor memory device 120 according to this embodiment also includes the stacked body ML (the first stacked body ML1), the conductive pillar PBG (the first conductive pillar PBG1), the inner insulating film 49 (the first pillar inner insulating film 49p1), the semiconductor pillar SP (the first semiconductor pillar SP1), the intermediate insulating film 42 (the first pillar intermediate insulating film 42p1), the memory layer 48 (the first pillar memory layer 48p1), and the outer insulating film 43 (the first pillar outer insulating film 43p1).

The nonvolatile semiconductor memory device 120 further includes the second stacked body ML2, the second conductive pillar PBG2, the second pillar inner insulating film 49p2, the second semiconductor pillar SP2, the second pillar intermediate insulating film 42p2, the second pillar memory layer 48p2, and the second pillar outer insulating film 43p2.

In the nonvolatile semiconductor memory device 120, the first electrode film 61a and the second electrode film 61b do not have the configurations of the electrode film 61A and the electrode film 61B of being combined with each other in the comb teeth configurations opposing in the X-axis direction illustrated in FIG. 3. Each of the first electrode films 61a and the second electrode films 61b has a band configuration extending in the X-axis direction.

Otherwise, the configuration (the stacked body ML, the conductive pillar PBG, the inner insulating film 49, the semiconductor pillar SP, the intermediate insulating film 42, the memory layer 48, and the outer insulating film 43) can be similar to the configuration of the nonvolatile semiconductor memory device 110, and a description is therefore omitted.

The nonvolatile semiconductor memory device 120 further includes the semiconductor connection portion SC (the first semiconductor connection portion SC1), the first selection gate electrode SG1, the second selection gate electrode SG2, the first interconnect WR1 (a first conductive interconnect LL1), the second interconnect WR2 (a second conductive interconnect LL2), and the third interconnect WR3 (the back gate line BGL).

The semiconductor connection portion SC (the first semiconductor connection portion SC1) electrically connects the one end of the first semiconductor pillar SP1 to the one end of the second semiconductor pillar SP2.

The first selection gate electrode SG1 is pierced by the first semiconductor pillar SP1 and stacked with the first stacked body ML1 in the first direction. The second selection gate electrode SG2 is pierced by the second semiconductor pillar SP2 and stacked with the second stacked body ML2 in the first direction. The first selection gate electrode SG1 and the second selection gate electrode SG2 have band configurations extending in the X-axis direction.

The first interconnect WR1 (the first conductive interconnect LL1) is electrically connected to the other end of the first semiconductor pillar SP1. The second interconnect WR2 (the first conductive interconnect LL2) is electrically connected to the other end of the second semiconductor pillar SP2. The first interconnect WR1 and the second interconnect WR2 are divided by an inter-layer insulating film 23a.

The third interconnect WR3 (the back gate line BGL) is electrically connected to at least one selected from the one end of the first conductive pillar PBG1 and the one end of the second conductive pillar PBG2.

Thus, in the nonvolatile semiconductor memory device 120, the first electrode film 61a, the second electrode film 61b, the first selection gate electrode SG1, and the second selection gate electrode SG2 have portions extending in the third direction (the X-axis direction) perpendicular to the first direction and the second direction.

The first interconnect WR1 and the second interconnect WR2 have portions extending along the second direction.

The semiconductor connection portion SC (the first semiconductor connection portion SC1) extends in a direction oblique to the second direction and the third direction.

The X-axis direction in which the electrode films 61 are aligned intersects (is non-parallel) (in the nonvolatile semiconductor memory device 110, is orthogonal) to the Y-axis direction in which the interconnects (the first interconnect WR1 and the second interconnect WR2) extend; and the semiconductor connection portion SC extends in a direction oblique to the Y-axis direction and the X-axis direction.

A memory string having a U-shaped configuration including the first semiconductor pillar SP1, the second semiconductor pillar SP2, and the semiconductor connection portion SC is multiply provided repeatedly along the X-axis direction and the Y-axis direction. The first interconnect WR1 and the second interconnect WR2 are multiply provided repeatedly along the X-axis direction.

The first interconnect WR1 and the second interconnect WR2 are in the same layer; and, for example, the distance from the first interconnect WR1 to the substrate 11 is substantially the same as the distance from the second interconnect WR2 to the substrate 11. The distance from the first interconnect WR1 to the first stacked body ML1 is the same as the distance from the second interconnect WR2 to the first stacked body ML1.

By disposing the semiconductor connection portion SC along the direction oblique to the Y-axis direction and the X-axis direction, the first semiconductor pillar SP1 and the second semiconductor pillar SP2 piercing mutually different electrode films 61 (the first electrode films 61a and the second electrode films 61b), respectively, are connected to mutually different interconnects (the first interconnect WR1 and the second interconnect WR2), respectively, extend along the same direction (the second direction). Thereby, the memory cells MC formed at the intersections between the first semiconductor pillar SP1 and the first electrode films 61a and the memory cells MC formed at the intersections between the second semiconductor pillar SP2 and the second electrode films 61b can be operated independently from each other.

By using the first conductive pillar PBG1 and the second conductive pillar PBG2 as the back gate in the nonvolatile semiconductor memory device 120, the erasing operation can be implemented stably similarly to the nonvolatile semiconductor memory device 110 according to the first embodiment.

The nonvolatile semiconductor memory device 120 further includes the core connection portion CBG (the first core connection portion CBG1) that electrically connects an end (e.g., the one other end) of the first conductive pillar PBG1 to an end (e.g., the one other end) of the second conductive pillar PBG2 and includes the connection portion inner insulating film 49c (the first connection portion inner insulating film 49c1) provided between the semiconductor connection portion SC (the first semiconductor connection portion SC1) and the core connection portion CBG (the first core connection portion CBG1). The core connection portion CBG (the first core connection portion CBG1) also extends in the direction oblique to the second direction and the third direction.

The nonvolatile semiconductor memory device 120 further includes the connection portion conductive layer SCC, the connection portion intermediate insulating film (the first connection portion intermediate insulating film 42c1), the connection portion memory layer (the first connection portion memory layer 48c1), and the connection portion outer insulating film (the first connection portion outer insulating film 43c1). The configurations thereof may be similar to those described in regard to the first embodiment.

In the erasing operation of the nonvolatile semiconductor memory device 120, operations similar to those described in regard to FIG. 6A and FIG. 6B, for example, may be applied. In the programming operation, operations similar to those described in regard to FIG. 7A to FIG. 7D, for example, may be applied. In such a case, the bit line voltage VBL and the source line voltage VSL described in regard to FIG. 7A are applied to the first interconnect WR1 (the first conductive interconnect LL1) and the second interconnect WR2 (the second conductive interconnect LL2). In the reading operation of the nonvolatile semiconductor memory device 120 as well, the reading operation described in regard to the nonvolatile semiconductor memory device 110, for example, may be applied.

An example of a method for manufacturing the nonvolatile semiconductor memory device 120 will now be described.

FIG. 10 to FIG. 15 are schematic cross-sectional views in order of the processes, illustrating the method for manufacturing the nonvolatile semiconductor memory device according to the second embodiment.

Figure 10:
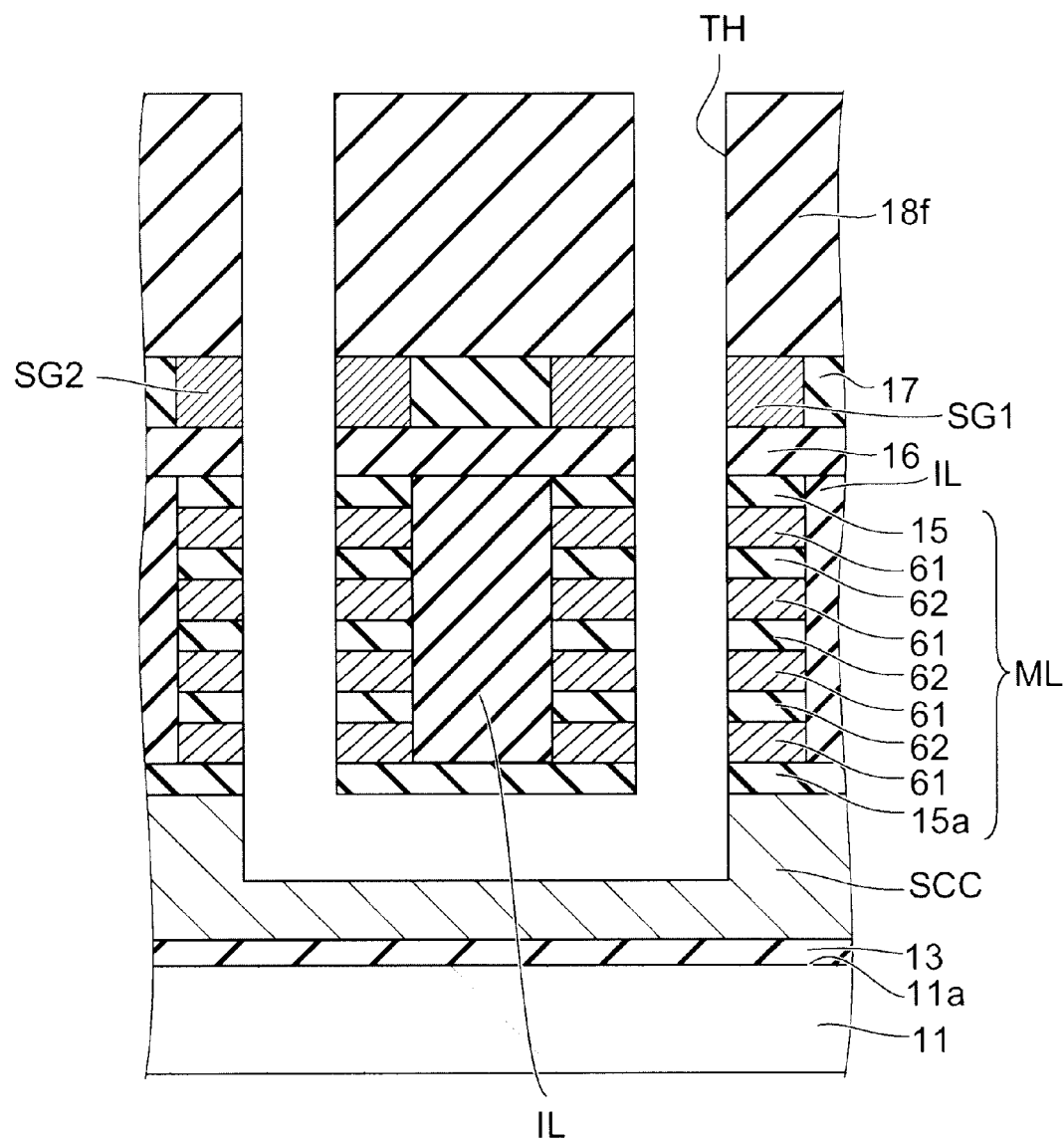
FIG. 10 is a schematic cross-sectional view in order of the processes, illustrating a method for manufacturing the nonvolatile semiconductor memory device according to the second embodiment.

As illustrated in FIG. 10, for example, the inter-layer insulating film 13 and a connection portion conductive film SCCf used to form the connection portion conductive layer SCC are formed on the major surface 11a of the substrate 11; a trench is made in the region where the semiconductor connection portion SC is formed; and a sacrificial layer is filled into the trench. Subsequently, the insulating film 15a is formed thereon; and then the stacked body ML including the insulating film 15 and the alternately stacked electrode films 61 and inter-electrode insulating films 62 are formed. Then, a trench is made to divide the stacked body ML along the Y-axis direction; and an insulating material is filled into the trench to form the insulating layer IL to divide the electrode films 61 from each other. The inter-layer insulating film 16 is formed thereon. The inter-layer insulating film 17 is formed thereon; a trench is made in the inter-layer insulating film 17; and a conductive material is filled into the trench to form the selection gate electrode SG (the first selection gate electrode SG1 and the second selection gate electrode SG2). An inter-layer insulating film 18f is formed thereon. Then, the through-hole TH is made from the upper face of the inter-layer insulating film 18f to reach the sacrificial layer filled into the trench made in the connection portion conductive film SCCf. The sacrificial layer filled into the trench made in the connection portion conductive film SCCf is removed via the through-hole TH. Thereby, a memory hole having a U-shaped configuration is made.

Figure 11:
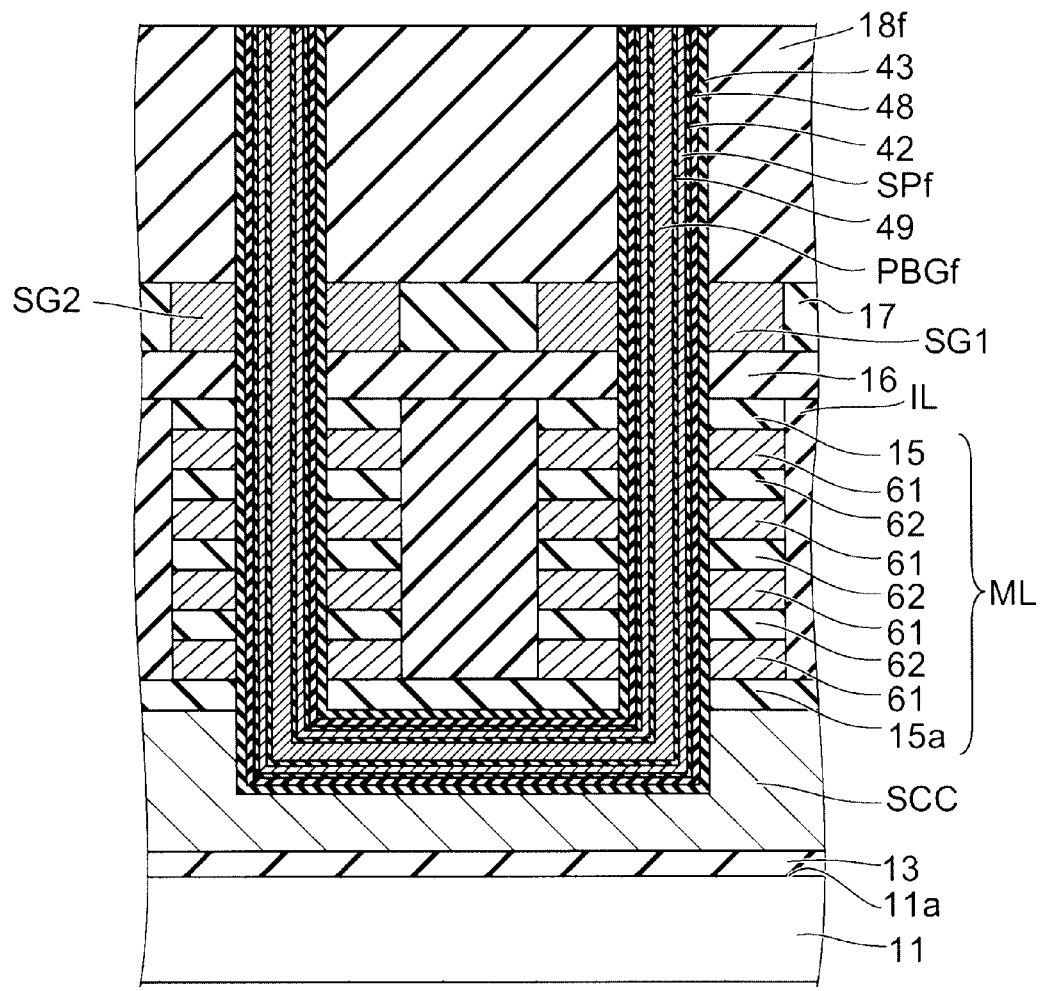
FIG. 11 is a schematic cross-sectional view in order of the processes, illustrating a method for manufacturing the nonvolatile semiconductor memory device according to the second embodiment.

Then, as illustrated in FIG. 11, the outer insulating film 43, the memory layer 48, the intermediate insulating film 42, a semiconductor pillar film SPf used to form the semiconductor pillar SP, the inner insulating film 49, and a conductive pillar film PBGf used to form the conductive pillar PBG are formed sequentially on the wall face inside the through-hole TH.

Thereby, the first pillar outer insulating film 43p1, the second pillar outer insulating film 43p2, and the connection portion outer insulating film (the first connection portion outer insulating film 43c1) are formed collectively. Then, the first pillar memory layer 48p1, the second pillar memory layer 48p2, and the connection portion memory layer (the first connection portion memory layer 48c1) are formed collectively. Then, the first pillar intermediate insulating film 42p1, the second pillar intermediate insulating film 42p2, and the connection portion intermediate insulating film (the first connection portion intermediate insulating film 42c1) are formed collectively. Then, the first semiconductor pillar SP1, the second semiconductor pillar SP2, and the connection portion conductive layer SCC are formed collectively. Then, the first pillar inner insulating film 49p1, the second pillar inner insulating film 49p2, and the connection portion inner insulating film 49c (the first connection portion inner insulating film 49c1) are formed collectively. Then, the first conductive pillar PBG1, the second conductive pillar PBG2, and the core connection portion CBG (the first core connection portion CBG1) are formed collectively.

If necessary, a protective layer may be provided on the upper end portion (the side opposite to the substrate 11) of the semiconductor pillar SP to protect the semiconductor pillar SP from the various subsequent processing. The protective layer may include, for example, silicon oxide or silicon nitride obtained by selectively oxidizing or nitriding the semiconductor pillar film SPf, etc.

Figure 12:
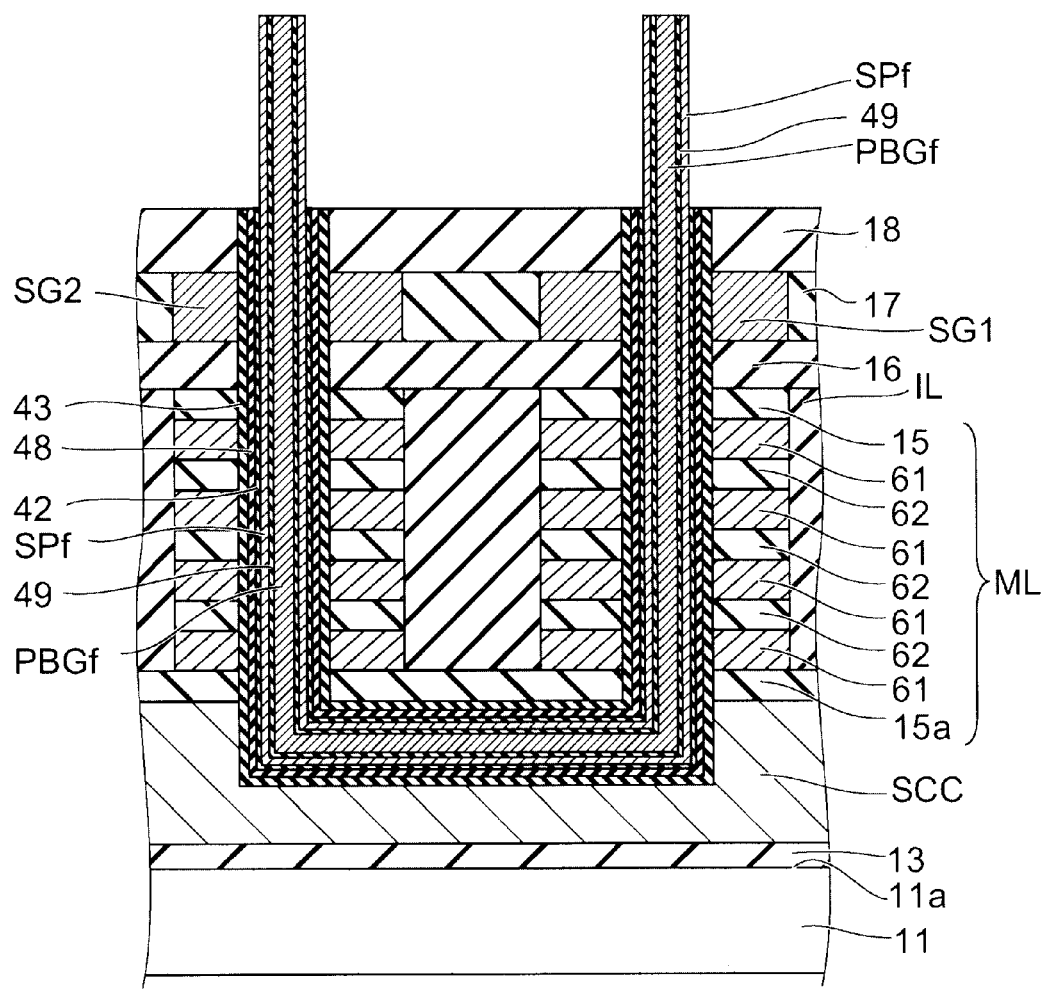
FIG. 12 is a schematic cross-sectional view in order of the processes, illustrating a method for manufacturing the nonvolatile semiconductor memory device according to the second embodiment.

Then, as illustrated in FIG. 12, etch-back of the inter-layer insulating film 18f is performed to form the inter-layer insulating film 18. Then, the portions of the outer insulating film 43, the memory layer 48, and the intermediate insulating film 42 exposed from the inter-layer insulating film 18 are removed. Thereby, the side face of the portion of the semiconductor pillar film SPf exposed from the inter-layer insulating film 18 is exposed. If necessary, the semiconductor pillar film SPf is doped with an impurity.

Figure 13:
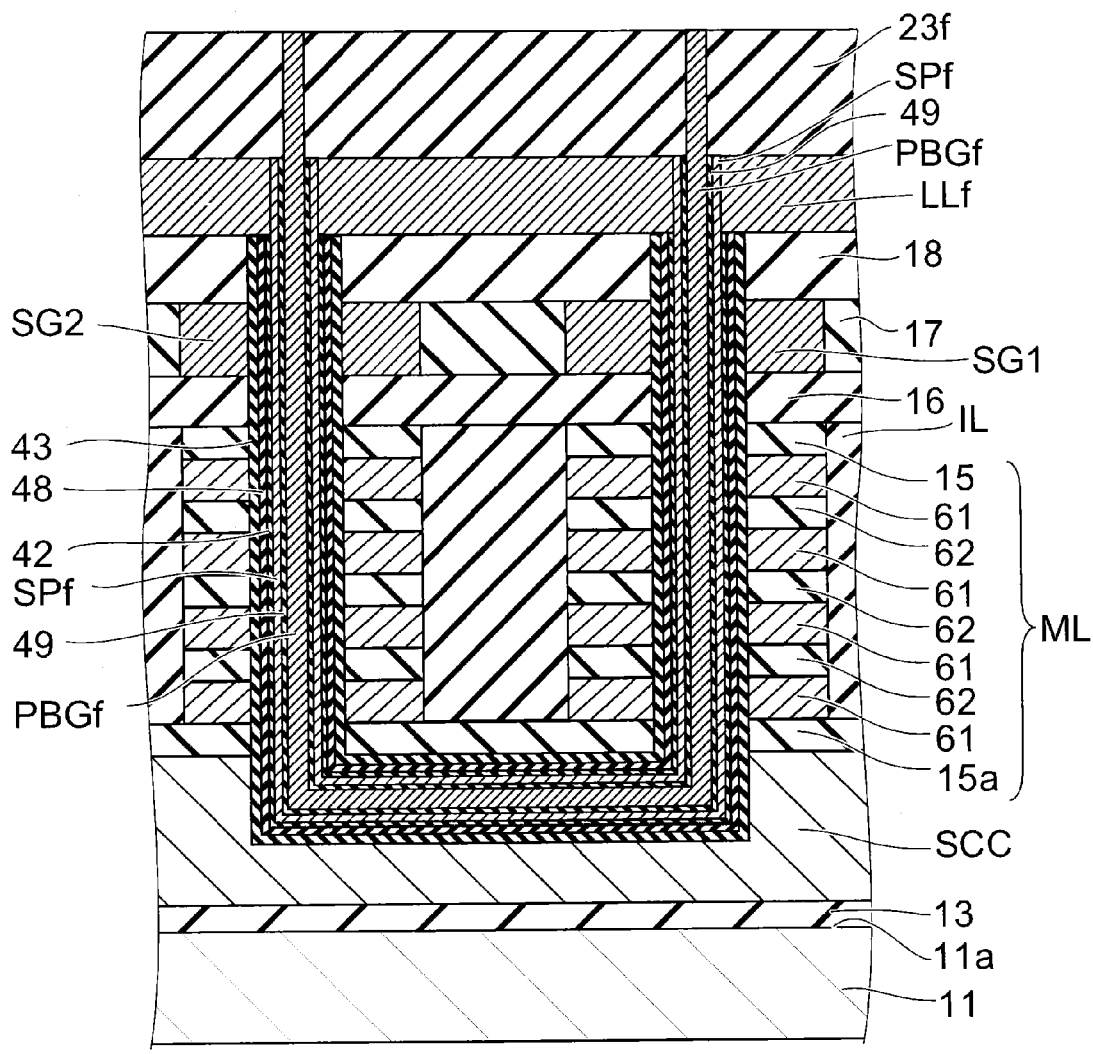
FIG. 13 is a schematic cross-sectional view in order of the processes, illustrating a method for manufacturing the nonvolatile semiconductor memory device according to the second embodiment.

Then, as illustrated in FIG. 13, a conductive interconnect film LLf used to form the first interconnect WR1 and the second interconnect WR2 is formed to cover the inter-layer insulating film 18 and the exposed semiconductor pillar film SPf. The conductive interconnect film LLf may include, for example, polysilicon. The inter-layer insulating film 23f is further formed thereon. Although the side face of the semiconductor pillar film SPf is covered with the conductive interconnect film LLf at this time, the conductive interconnect film LLf of the side face of the semiconductor pillar film SPf may be selectively oxidized to form an insulator if necessary.

Figure 14:
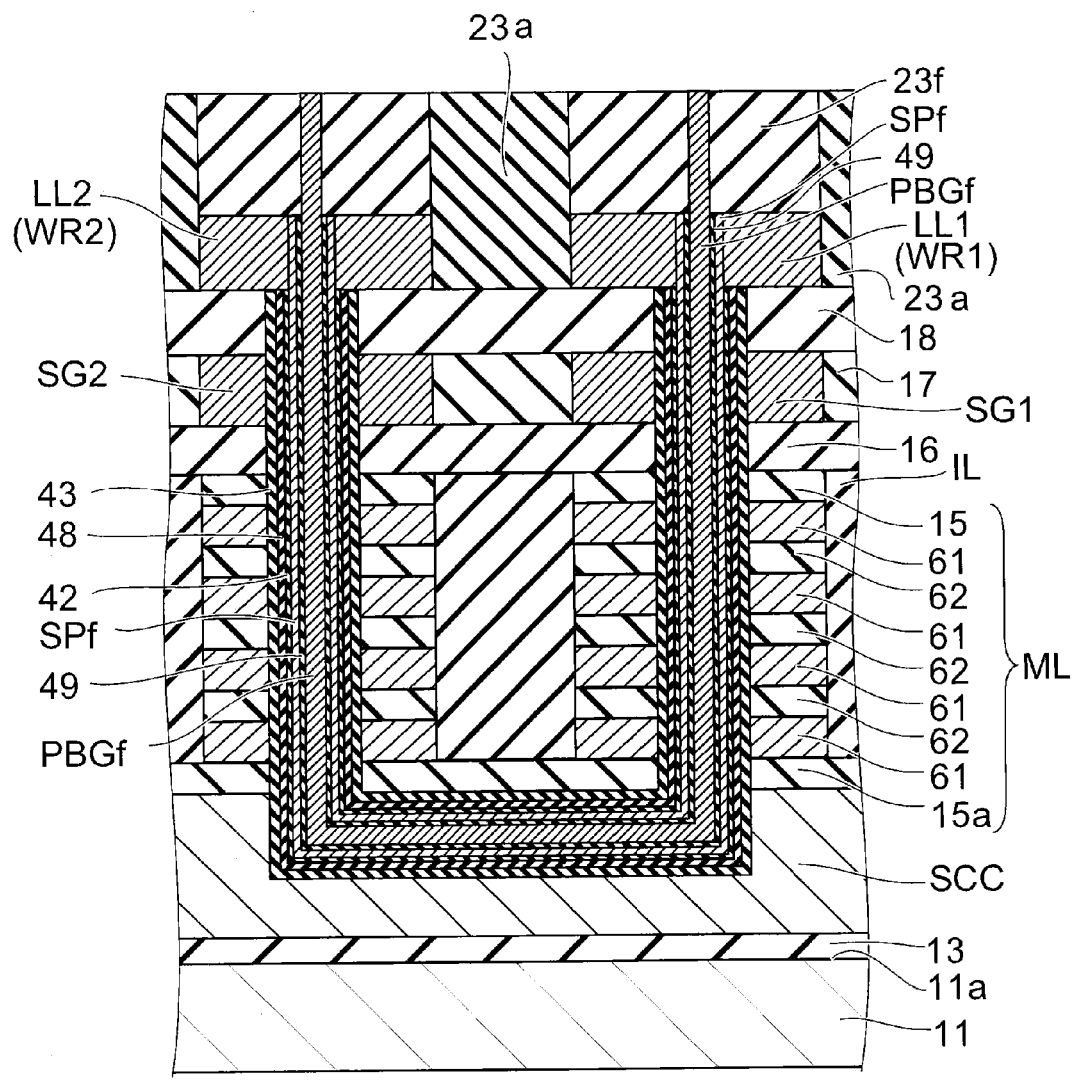
FIG. 14 is a schematic cross-sectional view in order of the processes, illustrating a method for manufacturing the nonvolatile semiconductor memory device according to the second embodiment.

Then, as illustrated in FIG. 14, a trench is made in the inter-layer insulating film 23f; the inter-layer insulating film 23f in which the trench is made is used as a mask; and the conductive interconnect film LLf is divided to form the first interconnect WR1 and the second interconnect WR2. Subsequently, an insulating material is filled into the trench of the inter-layer insulating film 23f to form the inter-layer insulating film 23a.

Figure 15:
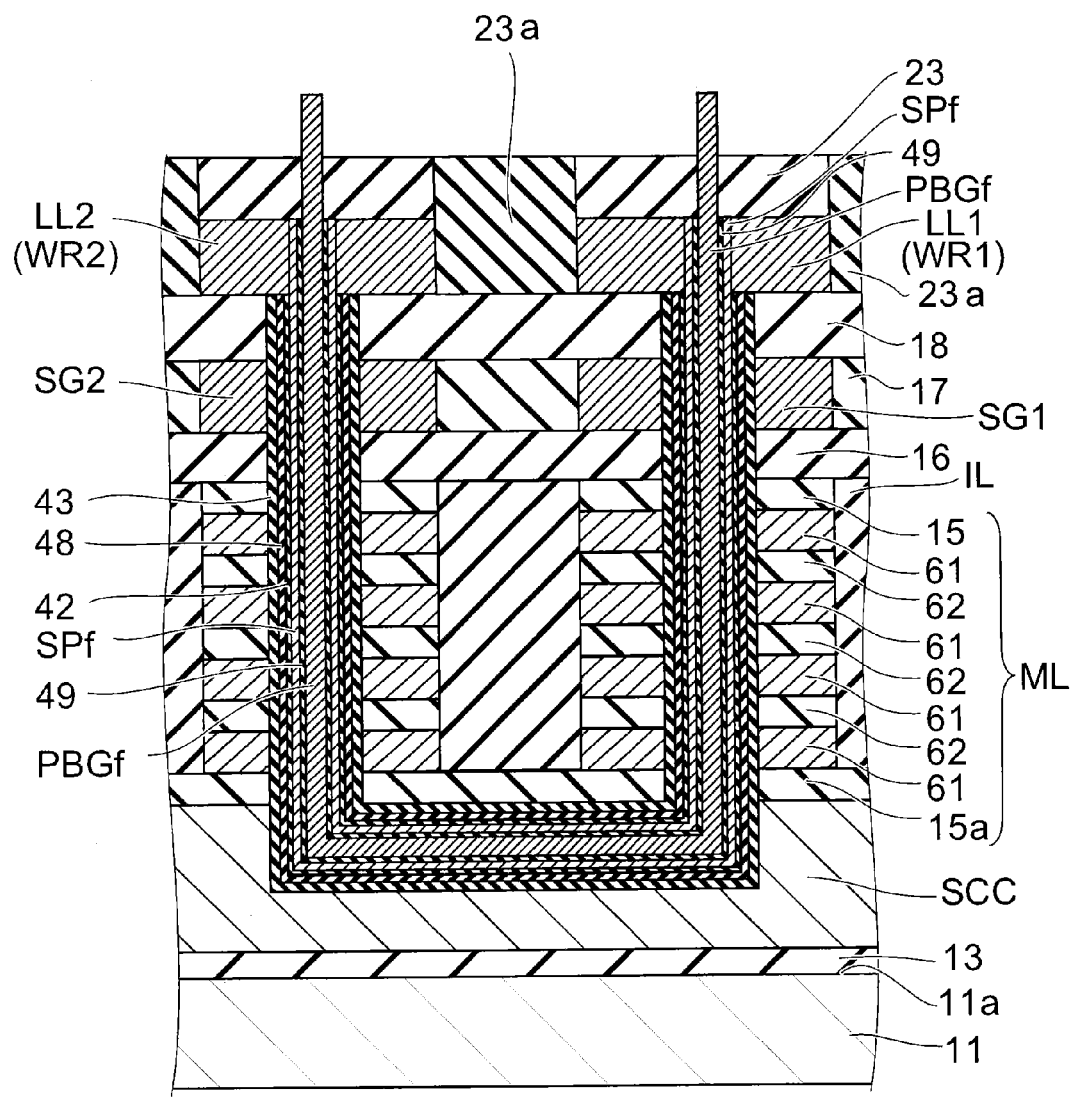
FIG. 15 is a schematic cross-sectional view in order of the processes, illustrating a method for manufacturing the nonvolatile semiconductor memory device according to the second embodiment.

Then, as illustrated in FIG. 15, etch-back of the inter-layer insulating film 23f and the inter-layer insulating film 23a is performed. Thereby, the inter-layer insulating film 23 is formed. Subsequently, etch-back is performed to remove the semiconductor pillar film SPf exposed from the inter-layer insulating film 23; and etch-back is further performed to remove the inner insulating film 49 exposed from the inter-layer insulating film 23. Thereby, the side face of the conductive pillar film PBGf is exposed. At this time, if necessary, the upper end portion of the semiconductor pillar film SPf may be selectively oxidized to provide an insulating layer on the upper end portion of the semiconductor pillar film SPf. Subsequently, a conductive film used to form the back gate line BGL is formed to cover the inter-layer insulating film 23, the inter-layer insulating film 23a, and the exposed conductive pillar film PBGf.

By the prescribed processes, the patterning of the electrode films 61 and the formation of the various contact electrodes in the interconnect connection unit MU2 and the formation of the interconnects connected to each of the first interconnect WR1, the second interconnect WR2, and the third interconnect WR3 are performed.

Thereby, the nonvolatile semiconductor memory device 120 illustrated in FIG. 8 and FIG. 9 is formed.

Third Embodiment

Figure 16:
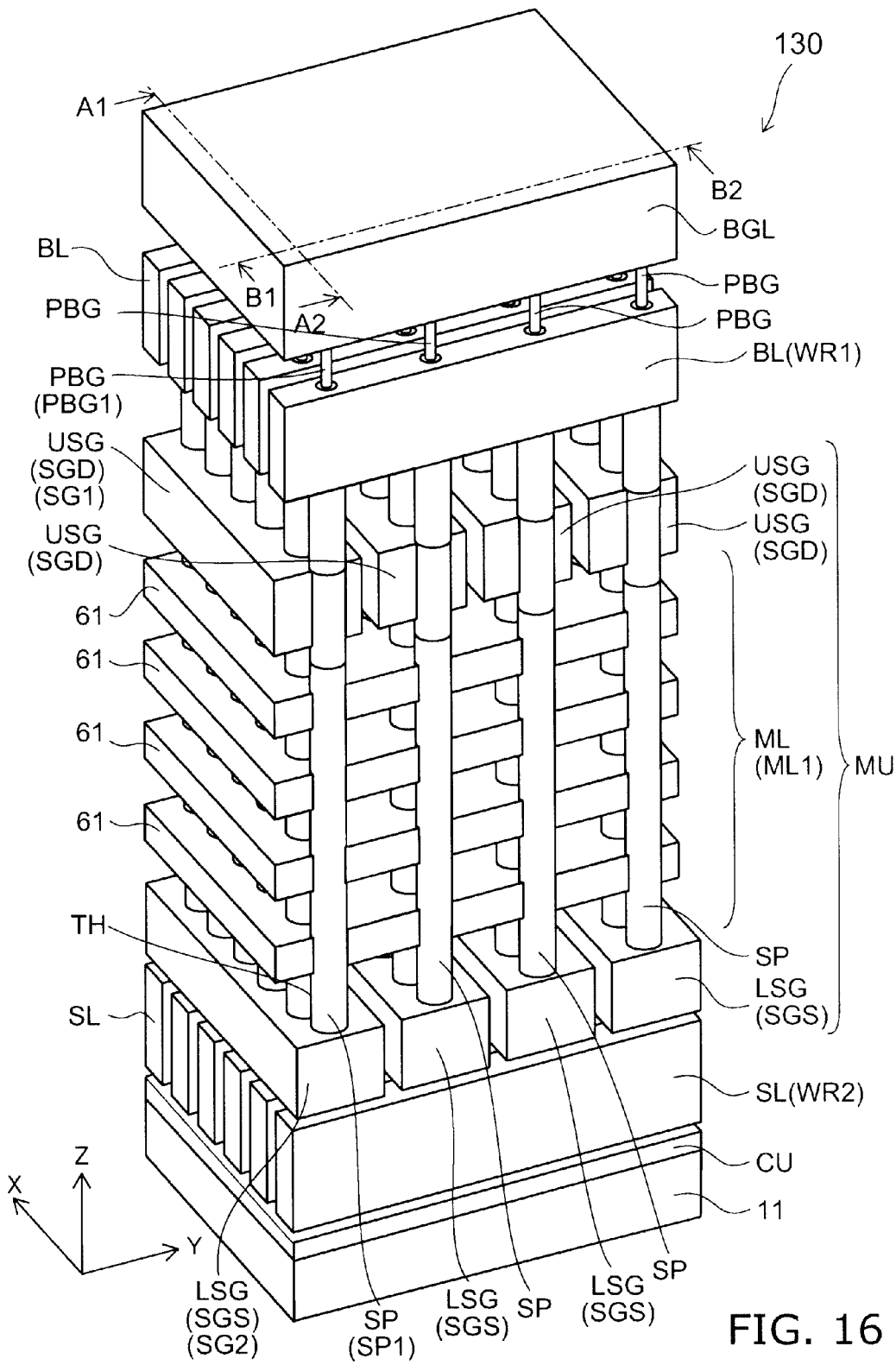
FIG. 16 is a schematic perspective view illustrating a nonvolatile semiconductor memory device according to a third embodiment.

FIG. 16 is a schematic perspective view illustrating the configuration of a nonvolatile semiconductor memory device according to a third embodiment.

For easier viewing of the drawing in FIG. 16, only the conductive portions are illustrated, and the insulating portions are omitted.

Figure 17:
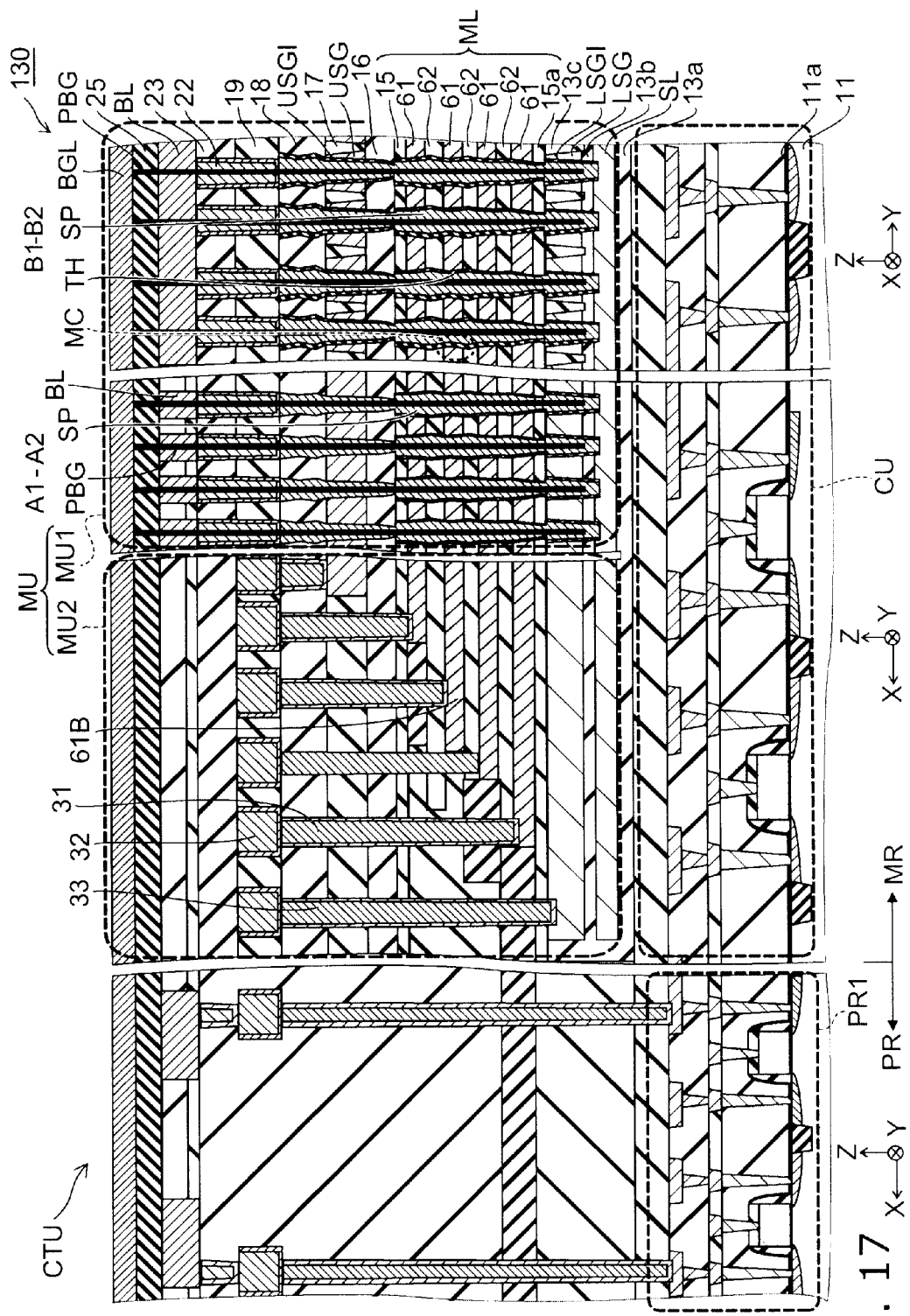
FIG. 17 is a schematic cross-sectional view illustrating the nonvolatile semiconductor memory device according to the third embodiment.

FIG. 17 is a schematic cross-sectional view illustrating the configuration of the nonvolatile semiconductor memory device according to the third embodiment.

Namely, FIG. 17 illustrates a portion of the cross section along line A1-A2 of FIG. 16 and a portion of the cross section along line B1-B2 of FIG. 16 as the matrix memory cell unit MU1.

Figure 18:
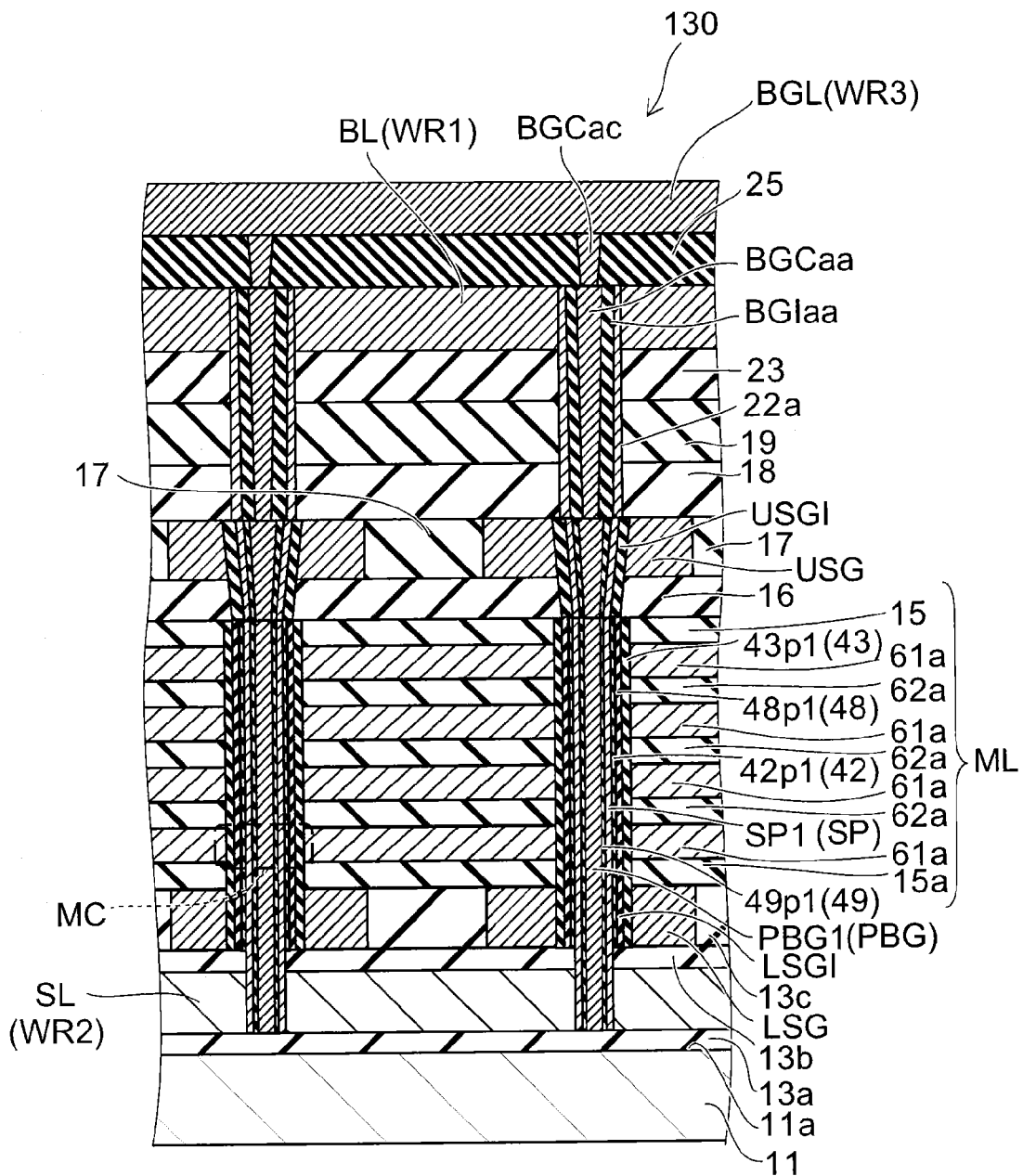
FIG. 18 is a schematic cross-sectional view illustrating a portion of the nonvolatile semiconductor memory device according to the third embodiment.

FIG. 18 is a schematic cross-sectional view illustrating the configuration of a portion of the nonvolatile semiconductor memory device according to the third embodiment.

Namely, FIG. 18 illustrates the configuration of the matrix memory cell unit MU1 and is a cross-sectional view corresponding to a portion of the cross section along line B1-B2 of FIG. 16. The circuit unit CU is not illustrated in FIG. 18.

The semiconductor connection portion SC is not provided in the nonvolatile semiconductor memory device 130 according to this embodiment as illustrated in FIG. 16, FIG. 17, and FIG. 18; and each of the semiconductor pillars SP are independent. In other words, a NAND string having a straight line configuration is provided in the nonvolatile semiconductor memory device 130.

The nonvolatile semiconductor memory device 130 includes the stacked body ML (the first stacked body ML1), the conductive pillar PBG (the first conductive pillar PBG1), the inner insulating film 49 (the first pillar inner insulating film 49p1), the semiconductor pillar SP (the first semiconductor pillar SP1), the intermediate insulating film 42 (the first pillar intermediate insulating film 42p1), the memory layer 48 (the first pillar memory layer 48p1), and the outer insulating film 43 (the first pillar outer insulating film 43p1).

The configurations thereof may be similar to those of the first and second embodiments, and a description is therefore omitted.

In the memory unit MU of the nonvolatile semiconductor memory device 130, an upper selection gate electrode USG (the first selection gate electrode SG1, e.g., forming a drain-side selection gate electrode SGD) is provided on the stacked unit ML; and a lower selection gate electrode LSG (the second selection gate electrode SG2, e.g., forming a source-side selection gate electrode SGS) is provided under the stacked unit ML.

In other words, the nonvolatile semiconductor memory device 130 further includes the first selection gate electrode SG1 pierced by the first semiconductor pillar SP1 and stacked with the first stacked body ML1 in the first direction and further includes the second selection gate electrode SG2 pierced by the first semiconductor pillar SP1 and stacked with the first stacked body ML1 on the side of the first stacked body ML1 opposite to the first selection gate electrode SG1. Namely, the first stacked body ML1 is disposed between the first selection gate electrode SG1 and the second selection gate electrode SG2.

An upper selection gate insulating film USGI is provided between the upper selection gate electrode USG and the semiconductor pillar SP; and a lower selection gate insulating film LSGI is provided between lower selection gate electrode LSG and the semiconductor pillar SP.

The stacked film of the intermediate insulating film 42, the memory layer 48, and the outer insulating film 43 recited above may be used as the selection gate insulating film SGI (the upper selection gate insulating film USGI and the lower selection gate insulating film LSGI); and an insulating film different from the stacked film of the intermediate insulating film 42, the memory layer 48, and the outer insulating film 43 may be used. The selection gate insulating film SGI may be a single-layer film or a stacked film.

The source line SL (e.g., the second interconnect WR2) is provided on the lower side of the lower selection gate electrode LSG. An inter-layer insulating film 13a is provided under the source line SL; and an inter-layer insulating film 13b is provided between the source line SL and the lower selection gate electrode LSG.

The semiconductor pillar SP is connected to the source line SL below the lower selection gate electrode LSG. The semiconductor pillar SP is connected to the bit line BL (e.g., the first interconnect WR1) above the upper selection gate electrode USG. The memory cells MC are formed in the stacked unit ML between the upper selection gate electrode USG and the lower selection gate electrode LSG. The semiconductor pillar SP functions as one NAND string having a straight-line configuration.

The upper selection gate electrodes USG are divided in the Y-axis direction by the inter-layer insulating film 17 and have band configurations extending along the X-axis direction. The lower selection gate electrodes LSG are divided in the Y-axis direction by an inter-layer insulating film 13c and have band configurations extending along the X-axis direction.

On the other hand, the bit lines BL connected to the upper portions of the semiconductor pillars SP and the source lines SL connected to the lower portions of the semiconductor pillars SP have band configurations extending in the Y-axis direction.

In the nonvolatile semiconductor memory device 130, the electrode film 61 is a conductive film having a plate configuration parallel to the X-Y plane.

The back gate line BGL (the third interconnect WR3) connected to the conductive pillar PBG is provided in the nonvolatile semiconductor memory device 130.

The third interconnect WR3 is provided on the side of the first interconnect WR1 (in this example, the bit line BL) opposite to the stacked body ML (the first stacked body ML1). Namely, at least a part of the first interconnect WR1 is disposed between the third interconnect WR3 and the stacked body ML (the first stacked body ML1). The conductive pillar PBG (the first conductive pillar PBG1) pierces the first interconnect WR1 along the first direction.

The back gate line BGL is electrically connected to the first conductive pillar PBG1 via, for example, the contact electrode BGCaa and the contact electrode BGCac. The contact electrode portion insulating layer BGIaa is provided between the contact electrode BGCaa and the contact electrode 22a.

In the nonvolatile semiconductor memory device 130 having such a structure as well, the erasing operation can be implemented stably by using the conductive pillar PBG as the back gate.

Fourth Embodiment

Figure 19:
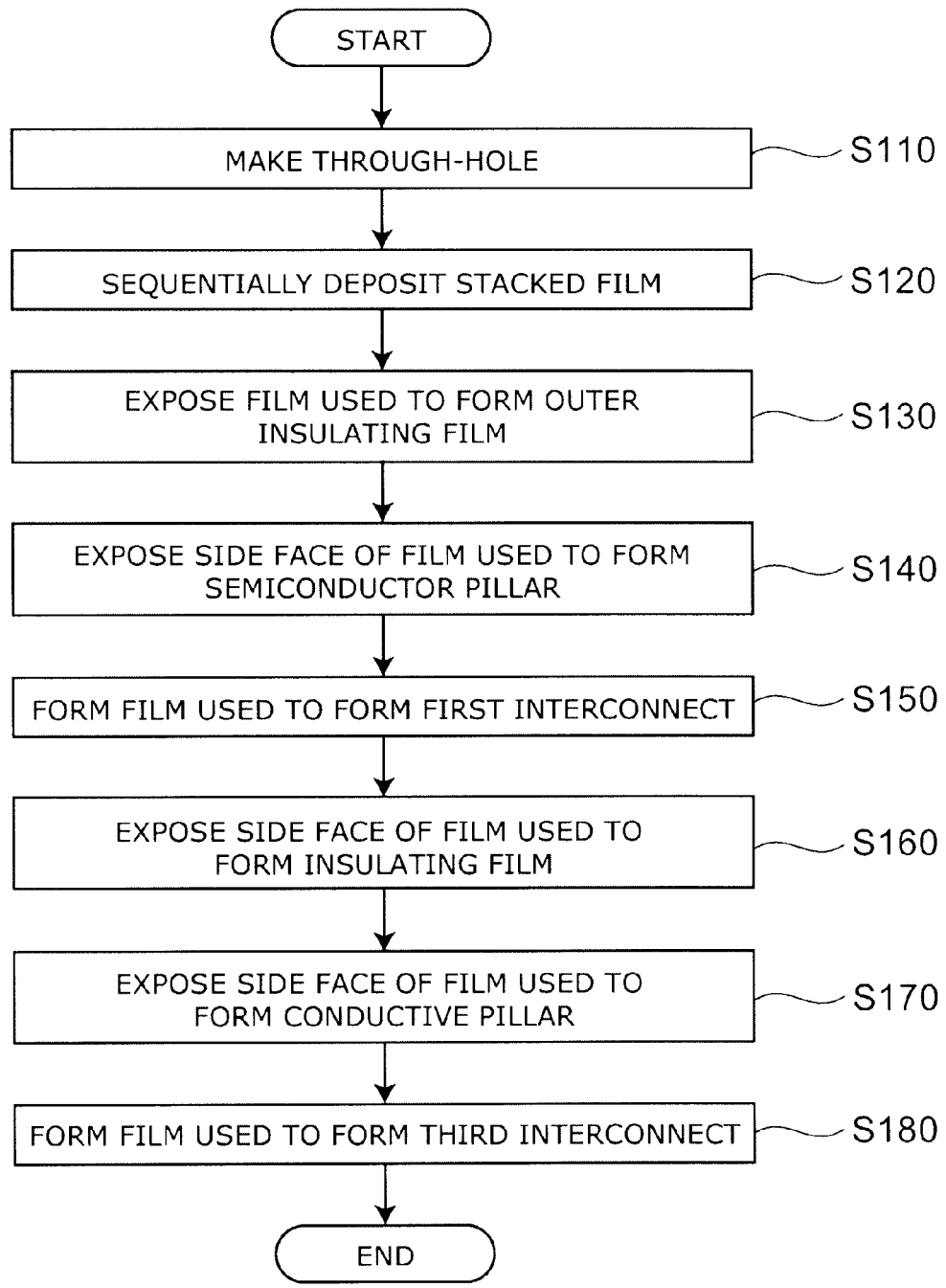
FIG. 19 is a flowchart illustrating a method for manufacturing a nonvolatile semiconductor memory device according to a fourth embodiment.

FIG. 19 is a flowchart illustrating a method for manufacturing a nonvolatile semiconductor memory device according to a fourth embodiment.

The method for manufacturing the nonvolatile semiconductor memory device according to this embodiment is a method for manufacturing a nonvolatile semiconductor memory device, for example, including: the first stacked body ML1 including the multiple first electrode films 61a stacked in the first direction and the first inter-electrode insulating film 62a provided between the multiple first electrode films 61a; the first conductive pillar PBG1 piercing the first stacked body ML1 in the first direction; the first pillar inner insulating film 49p1 provided between the first conductive pillar PBG1 and the first electrode films 61a, the first pillar inner insulating film 49p1 being provided around a side face of the first conductive pillar PBG1; the first semiconductor pillar SP1 provided between the first pillar inner insulating film 49p1 and the first electrode films 61a to pierce the first stacked body ML1 in the first direction, the first semiconductor pillar SP1 being provided around a side face of the first pillar inner insulating film 49p1; the first pillar intermediate insulating film 42p1 provided between the first semiconductor pillar SP1 and the first electrode films 61a, the first pillar intermediate insulating film 42p1 being provided around a side face of the first semiconductor pillar SP1; the first pillar memory layer 48p1 provided between the first pillar intermediate insulating film 42p1 and the first electrode film 61 as, the first pillar memory layer 48p1 being provided around a side face of the first pillar intermediate insulating film 42p1; the first pillar outer insulating film 43p1 provided between the first pillar memory layer 48p1 and the first electrode films 61a, the first pillar outer insulating film 43p1 being provided around a side face of the first pillar memory layer 48p1; and the first interconnect WR1 electrically connected to the first semiconductor pillar SP1.

In this manufacturing method as illustrated in FIG. 19, the through-hole TH is made along the first direction to pierce the first stacked body ML1 and the inter-layer insulating film (e.g., the inter-layer insulating film 18f) stacked with the first stacked body ML1 (step S110). In other words, the processing described in regard to, for example, FIG. 10 is performed.

Then, a stacked film of the film used to form the first pillar outer insulating film 43p1, the film used to form the first pillar memory layer 48p1, the film used to form the first pillar intermediate insulating film 42p1, the film used to form the first semiconductor pillar SP1, the film used to form the first pillar inner insulating film 49p1, and the film used to form the first conductive pillar PBG1 is deposited sequentially on the inner wall of the through-hole TH (step S120). In other words, the processing described in regard to, for example, FIG. 11 is performed.

Then, etch-back is performed on at least a portion of the inter-layer insulating film (e.g., the inter-layer insulating film 18f) to expose the film used to form the first pillar outer insulating film 43p1 recited above (step S130).

Then, the exposed film used to form the first pillar outer insulating film 43p1, the film used to form the first pillar memory layer 48p1, and the film used to form the first pillar intermediate insulating film 42p1 are removed to expose a side face of the film used to form the first semiconductor pillar SP1 (step S140).

In other words, the processing described in regard to, for example, FIG. 12 is performed in step S130 and step S140.

Then, the film used to form the first interconnect WR1 is formed to electrically contact the exposed side face of the film used to form the first semiconductor pillar SP1 (step S150). In other words, the processing described in regard to, for example, FIG. 13 is performed.

The nonvolatile semiconductor memory device according to this embodiment may further include the third interconnect WR3 electrically connected to the first conductive pillar PBG1. In the method for manufacturing the nonvolatile semiconductor memory device according to this embodiment, the following processing is further performed.

Namely, the film used to form the first semiconductor pillar SP1 is removed to expose a side face of the film used to form the first pillar inner insulating film 49p1 (step S160).

Then, the exposed film used to form the first pillar inner insulating film 49p1 is removed to expose a side face of the film used to form the first conductive pillar PBG1 (step S170).

Then, the film used to form the third interconnect WR3 is formed to electrically contact with (that is, electrically connected to) the exposed side face of the film used to form the first conductive pillar PBG1 (step S180).

In other words, the processing described in regard to FIG. 15 is performed in step S160, step S170, and step S180.

Thereby, the nonvolatile semiconductor memory device having the first conductive pillar PBG1 provided in the interior of the first semiconductor pillar SP1 can be manufactured efficiently.

According to the nonvolatile semiconductor memory device and the method for manufacturing the same according to the embodiments hereinabove, a nonvolatile semiconductor memory device having a collectively patterned three-dimensionally stacked memory configuration with improved erasing operation characteristics and a method for manufacturing the same can be provided.

Although the case is described above where silicon nitride is used as the memory layer 48, the embodiments are not limited thereto. The memory layer 48 may include a single-layer film or a stacked film, the single-layer film being one selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

The inter-electrode insulating film 62, the intermediate insulating film 42, and the outer insulating film 43 may include a single-layer film or a stacked film, the single-layer film being one selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, the stacked film being made of a plurality selected from the group.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile semiconductor memory devices such as electrode films, inter-electrode insulating films, selection gate electrodes, semiconductor pillars, conductive pillars, pillar inner insulating films, semiconductor connection portions, connection portion conductive films, memory layers, intermediate insulating films, outer insulating films, insulating films, conductive films, inter-layer insulating films, source lines, bit lines, back gate lines, interconnects, and the like from known art. Such practice is included in the scope of the invention to the extent that similar effects thereto are obtained.

Any two or more components of the specific examples may be combined within the extent of technical feasibility and are included in the scope of the invention to the extent that the purport of the invention is included.

The nonvolatile semiconductor memory device and the method for manufacturing the same described above as the embodiment of the invention can be suitably modified and practiced by those skilled in the art, and such modifications are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device, comprising:
   a first stacked body including a plurality of first electrode films stacked in a first direction and a first inter-electrode insulating film provided between the plurality of first electrode films;
   a first conductive pillar piercing the first stacked body in the first direction;
   a first pillar inner insulating film provided between the first conductive pillar and the first electrode films, the first pillar inner insulating film being provided around a side face of the first conductive pillar;

a first semiconductor pillar provided between the first pillar inner insulating film and the first electrode films to pierce the first stacked body along the first direction, the first semiconductor pillar being provided around a side face of the first pillar inner insulating film;

a first pillar intermediate insulating film provided between the first semiconductor pillar and the first electrode films, the first pillar intermediate insulating film being provided around a side face of the first semiconductor pillar;

a first pillar memory layer provided between the first pillar intermediate insulating film and the first electrode films, the first pillar memory layer being provided around a side face of the first pillar intermediate insulating film;

a first pillar outer insulating film provided between the first pillar memory layer and the first electrode films, the first pillar outer insulating film being provided around a side face of the first pillar memory layer;

a second stacked body, a second direction from the first stacked body toward the second stacked body intersecting the first direction, the second stacked body including a plurality of second electrode films stacked in the first direction and a second inter-electrode insulating film provided between the plurality of second electrode films;

a second conductive pillar piercing the second stacked body in the first direction;

a second pillar inner insulating film provided between the second conductive pillar and the second electrode films, the second pillar inner insulating film being provided around a side face of the second conductive pillar;

a second semiconductor pillar provided between the second pillar inner insulating film and the second electrode films to pierce the second stacked body in the first direction, the second semiconductor pillar being provided around a side face of the second pillar inner insulating film;

a second pillar intermediate insulating film provided between the second semiconductor pillar and the second electrode films, the second pillar intermediate insulating film being provided around a side face of the second semiconductor pillar;

a second pillar memory layer provided between the second pillar intermediate insulating film and the second electrode films, the second pillar memory layer being provided around a side face of the second pillar intermediate insulating film;

a second pillar outer insulating film provided between the second pillar memory layer and the second electrode films, the second pillar outer insulating film being provided around a side face of the second pillar memory layer;

a semiconductor connection portion electrically connecting one end of the first semiconductor pillar to one end of the second semiconductor pillar and provided between the first semiconductor pillar and the second semiconductor pillar; and a core connection portion electrically connecting one end of the first conductive pillar proximate to the one end of the first semiconductor pillar to one end of the second conductive pillar proximate to the one end of the second semiconductor pillar.

2. The device according to claim 1, further comprising a control unit electrically connected to the plurality of first electrode films and the first conductive pillar to control a state of a charge stored in the first pillar memory layer, the control unit applying a voltage to the first conductive pillar, the voltage being higher than a voltage applied to the first electrode films in an operation of performing at least one selected from injecting holes into the first pillar memory layer and ejecting electrons from the first pillar memory layer.

3. The device according to claim 1, further comprising a substrate having a major surface,
the first stacked body being provided on the major surface of the substrate,
the first direction being perpendicular to the major surface.

4. The device according to claim 1, wherein a cross section of the first semiconductor pillar when cut by a plane perpendicular to the first direction is circular or flattened circular.

5. The device according to claim 1, wherein:
the first pillar inner insulating film extends between the first conductive pillar and the first inter-electrode insulating film;
the first pillar intermediate insulating film extends between the first semiconductor pillar and the first inter-electrode insulating film;
the first pillar memory layer extends between the first pillar intermediate insulating film and the first inter-electrode insulating film; and
the first pillar outer insulating film extends between the first pillar memory layer and the first inter-electrode insulating film.

6. The device according to claim 1, wherein the first conductive pillar includes at least one selected from amorphous silicon and polysilicon.

7. The device according to claim 1, further comprising:
a first selection gate electrode stacked with the first stacked body in the first direction, the first selection gate electrode being pierced by the first semiconductor pillar;
a second selection gate electrode stacked with the second stacked body in the first direction, the second selection gate electrode being pierced by the second semiconductor pillar;
a first interconnect electrically connected to an other end of the first semiconductor pillar;
a second interconnect electrically connected to an other end of the second semiconductor pillar; and
a third interconnect electrically connected to at least one selected from another end of the first conductive pillar and another end of the second conductive pillar.

8. The device according to claim 7, wherein:
the first electrode films and the second electrode films have portions extending in a third direction perpendicular to the first direction and the second direction;
the first interconnect has a portion extending along the second direction; and
the second interconnect has a portion extending along the third direction.

9. The device according to claim 7, wherein:
at least a part of the first interconnect is disposed between the third interconnect and the first stacked body; and
the first conductive pillar pierces the first interconnect along the first direction.

10. The device according to claim 1, further comprising:
a connection portion inner insulating film provided between the semiconductor connection portion and the core connection portion.

11. The device according to claim 10, further comprising:
a connection portion conductive layer provided opposing the semiconductor connection portion;

a connection portion intermediate insulating film provided between the semiconductor connection portion and the connection portion conductive layer;
a connection portion memory layer provided between the connection portion intermediate insulating film and the connection portion conductive layer; and
a connection portion outer insulating film provided between the connection portion memory layer and the connection portion conductive layer.

12. The device according to claim 1, wherein each of the plurality of first electrode films is positioned in a plane identical to each of the plurality of second electrode films, respectively.

13. The device according to claim 1, further comprising:
a first selection gate electrode stacked with the first stacked body in the first direction, the first selection gate electrode being pierced by the first semiconductor pillar;
a second selection gate electrode stacked with the second stacked body in the first direction, the second selection gate electrode being pierced by the second semiconductor pillar;
a first interconnect electrically connected to an other end of the first semiconductor pillar;
a second interconnect electrically connected to an other end of the second semiconductor pillar; and
a third interconnect electrically connected to at least one selected from another end of the first conductive pillar and another end of the second conductive pillar,
the first electrode films, the second electrode films, the first selection gate electrode, and the second selection gate electrode having portions extending in a third direction perpendicular to the first direction and the second direction,
the first interconnect and the second interconnect having portions extending along the second direction,
the semiconductor connection portion extending in a direction oblique to the second direction and the third direction.

14. The device according to claim 13, wherein:
at least a part of the first interconnect is disposed between the third interconnect and the first stacked body; and
the first conductive pillar pierces the first interconnect along the first direction.

15. The device according to claim 13, wherein each of the plurality of first electrode films is positioned in a plane identical to each of the plurality of second electrode films, respectively.

16. The device according to claim 13, wherein a distance between the first interconnect and the first stacked body is identical to a distance between the second interconnect and the second stacked body.

17. The device according to claim 1, comprising:
said first and second conductive pillars each having upper and lower ends, said lower ends respectively corresponding to said one ends of said first and second conductive pillars; and
said first and second semiconductor pillars each having upper and lower ends, said lower ends respectively corresponding to said one ends of said first and second semiconductor pillars.

* * * * *